(12) United States Patent
Kondo et al.

(10) Patent No.: US 9,355,916 B2
(45) Date of Patent: May 31, 2016

(54) SEMICONDUCTOR MANUFACTURING METHOD AND SEMICONDUCTOR DEVICE

(71) Applicant: FUJITSU LIMITED, Kawasaki-shi, Kanagawa (JP)

(72) Inventors: Daiyu Kondo, Atsugi (JP); Shintaro Sato, Atsugi (JP); Naoki Yokoyama, Machida (JP); Motonobu Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/668,103

(22) Filed: Mar. 25, 2015

(65) Prior Publication Data
US 2015/0279747 A1    Oct. 1, 2015

(30) Foreign Application Priority Data

Mar. 27, 2014 (JP) ................ 2014-066349

(51) Int. Cl.
| | |
|---|---|
| H01L 29/80 | (2006.01) |
| H01L 31/11 | (2006.01) |
| H01L 29/06 | (2006.01) |
| H01L 21/8238 | (2006.01) |
| H01L 21/44 | (2006.01) |
| H01L 27/12 | (2006.01) |
| H01L 27/092 | (2006.01) |
| H01L 23/532 | (2006.01) |
| H01L 21/768 | (2006.01) |

(Continued)

(52) U.S. Cl.
CPC .. *H01L 21/823871* (2013.01); *H01L 21/28525* (2013.01); *H01L 21/28575* (2013.01); *H01L 21/76877* (2013.01); *H01L 21/76897* (2013.01); *H01L 21/84* (2013.01); *H01L 23/5226* (2013.01); *H01L 23/53276* (2013.01); *H01L 27/0922* (2013.01); *H01L 27/1203* (2013.01); *H01L 27/124* (2013.01); *H01L 27/1259* (2013.01); *H01L 29/16* (2013.01); *H01L 29/201* (2013.01); *H01L 29/78681* (2013.01); *H01L 29/78684* (2013.01); *H01L 21/8258* (2013.01)

(58) Field of Classification Search
CPC ............ H01L 2924/00; H01L 29/1606; H01L 2224/73265; H01L 2224/48227; H01L 51/0048; H01L 31/18; H01L 29/78; H01L 2224/48247; H01L 2924/1306; H01M 4/133; H01M 4/926
USPC .......... 438/199, 279, 610, 652, 675; 257/274, 257/262, 288, 350, 574, 618
See application file for complete search history.

(56) References Cited

U.S. PATENT DOCUMENTS

| | | | |
|---|---|---|---|
| 2010/0261343 A1* | 10/2010 | Mizukoshi et al. ............ | 438/610 |
| 2011/0233779 A1* | 9/2011 | Wada ................ | B82Y 10/00 257/751 |

(Continued)

FOREIGN PATENT DOCUMENTS

JP    2012-49261 A1    3/2012

*Primary Examiner* — Hsien Ming Lee
(74) *Attorney, Agent, or Firm* — Kratz, Quintos & Hanson, LLP

(57) ABSTRACT

A method manufactures a semiconductor device which allows nanocarbon materials, such as high-quality graphene and carbon nanotube to be used. The method of manufacturing the semiconductor device comprises forming on a substrate a wiring structure including wires of nanocarbon material; forming on the wiring structure an element structure including a semiconductor element; and interconnecting the wires of the wiring structure and the semiconductor element of the element structure.

11 Claims, 19 Drawing Sheets

(51) Int. Cl.

| | |
|---|---|
| *H01L 29/786* | (2006.01) |
| *H01L 29/16* | (2006.01) |
| *H01L 29/201* | (2006.01) |
| *H01L 21/285* | (2006.01) |
| *H01L 21/84* | (2006.01) |
| *H01L 23/522* | (2006.01) |
| *H01L 21/8258* | (2006.01) |

(56) References Cited

U.S. PATENT DOCUMENTS

2012/0049370 A1    3/2012  Wada
2013/0119548 A1*   5/2013  Avouris et al. ................ 257/762
2015/0061131 A1*   3/2015  Saito et al. .................... 257/741

* cited by examiner

SEMICONDUCTOR MANUFACTURING METHOD AND SEMICONDUCTOR DEVICE

CROSS-REFERENCE TO RELATED APPLICATION

This application is based upon and claims the benefit of priority of the prior Japanese Patent Application No. 2014-066349, filed on Mar. 27, 2014, the entire contents of which are incorporated herein by reference.

FIELD

The embodiments discussed herein are related to a semiconductor device manufacturing method and a semiconductor device.

BACKGROUND

The LSI wiring structure used in the most advance devices have the wiring and the via diameter increasingly nanonized. Developments of using multi-layer graphene film as the LSI wires and carbon nanotubes as the via material are made. The multi-layer graphene and carbon nanotube are suitable for the nanonization and are expected to be used as low resistance materials which substitute the existing metal materials.

Related reference is as follows:
Japanese Patent Application Publication No. 2012-049261.

SUMMARY

According to an aspect of embodiments, a method of manufacturing a semiconductor device comprises: forming on a substrate a wiring structure including wires of a nanocarbon material; forming on the wiring structure an element structure including semiconductor elements; and interconnecting the wires of the wiring structure and the semiconductor element of the element structure.

According to another aspect of the embodiments, a method of manufacturing a semiconductor device comprises: forming a wiring structure including wires of a nanocarbon material; forming on a substrate an element structure including a semiconductor element; and transferring the wiring structure to the element structure formed on the substrate; and interconnecting the semiconductor element of the element structure and the wires of the wiring structure.

According to another aspect of the embodiments, a semiconductor device comprises: a wiring structure formed on a substrate and including wires of a nanocarbon material; and an element structure formed on the wiring structure and including an element structure including an semiconductor element, the wires of the wiring structure and the semiconductor element of the element structure being interconnected.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

In the conventional carbon nanotube wiring, on a substrate where semiconductor elements, such as transistors, capacitors, etc. are formed, carbon nanotube wires containing the contact layers, the first wiring layer, the via layers and the second wiring layer are formed.

However, in the conventional method, it is necessary to control the synthesis temperature of the nanotubes at low temperatures because low dielectric materials which are not perfectly resistive to high temperatures, and silicide in the channel parts, which makes it difficult to synthesize nanocarbon materials, such as high-quality graphene and carbon nanotubes.

[a] First Embodiment

The semiconductor device according to a first embodiment and the method of manufacturing the semiconductor device will be described with reference to FIGS. 1 through 6C.

Figure 1:
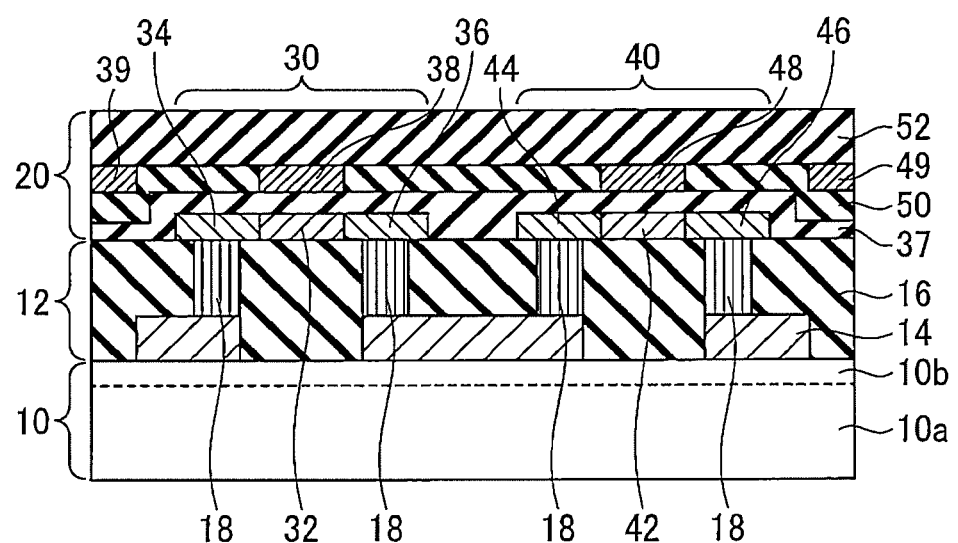
FIG. 1 is a view of the semiconductor device according to a first embodiment.

FIG. 1 is a view of the semiconductor device according to the first embodiment, which illustrates the semiconductor device, and FIGS. 2A through 6C are sectional views of the semiconductor device according to the first embodiment in the steps of the method of manufacturing the semiconductor device.

(Semiconductor Device)

The semiconductor device according to this embodiment will be described with reference to FIG. 1.

The semiconductor device according to this embodiment is a semiconductor device including a wiring structure of graphene wires and nanotube plugs formed on a substrate, and an element structure of, e.g., CMOS formed on the wiring structure.

On a silicon substrate 10 with an oxide film, a wiring structure 12 as first layer wires is formed, and on the wiring structure 12, an element structure 20 wired by the first layer wires is formed.

The silicon substrate 10 with an oxide film is, e.g., an about 90 nm-thickness silicon oxide film 10b formed on an about 380 nm-thickness silicon substrate 10a.

The wiring structure 12 includes graphene wires 14, formed on the silicon substrate 10 with an oxide film, an inter-layer insulation film 16 formed on the graphene wires 14, and nanotube plugs 18 contacting the graphene wires 14 and the element structure 20.

The graphene wires 14 are formed of, e.g., multi-layer graphene.

The wiring length of the graphene wires 14 formed of multi-layer graphene may be, e.g., 0.5-10000 nm, the wire width may be, e.g., 0.5-500 nm, and the wire thickness may be, e.g., 0.1-500 nm.

Specifically, it is preferable that the wire length of the graphene wires 14 formed of multi-layer graphene film is, e.g., 0.5-500 nm, the wire thickness is, e.g., 1-20 nm, and the wire thickness is, e.g., 1-20 nm.

The inter-layer insulation film 16 is formed of, e.g., silicon oxide film.

The film thickness of the inter-layer insulation film 16 may be, e.g., 1-1000 mm and specifically, is preferably, e.g., 2-200 nm.

The nanotubes plugs 18 are formed of, e.g., carbon nanotube (CNT).

The length of the nanotube plugs 18 formed of carbon nanotube may be, e.g., 1-500 nm, and the diameter may be, e.g., 0.5-500 nm.

Specifically, it is preferable that the length of the nanotube plugs 18 formed of carbon nanotube is, e.g., 1-50 nm, and the diameter is, e.g., 1-50 nm.

The element structure 20 formed on the wiring structure 12 is, e.g., a CMOS structure formed of an n-TFT 30 on the left side of FIG. 1, and a p-TFT 40 on the right side of FIG. 1.

The n-TFT 30 includes, e.g., a source electrode 34 and a drain electrode 46, formed of InGaAs—Ni alloy on both sides of a channel 32 formed of InGaAs.

The p-TFT 40 includes, e.g., a source electrode 44 and a drain electrode 46, formed of Ge—Ni alloy on both sides a channel 42 formed of Ge.

The channel length of the channel 32 of the n-TFT and the channel 42 of the p-TFT may be, e.g., 0.5-500 nm, and specifically, is preferably 1-500 nm.

The film thickness of the source electrode 34, the channel 32 and the drain electrode 36 of the n-TFT 30 may be, e.g., 0.5-500 nm, and specifically is preferably 1-50 nm.

The film thickness of the source electrode 44, the channel 42 and the drain electrode 46 may be, e.g., 0.5-500 nm and specifically is preferably 1-50 nm.

The source electrode 34 and the drain electrode 36 of the n-TFT 30 and the source electrode 44 and the drain electrode 46 of the p-TFT 40 are connected to the nanotube plugs 18 of the wiring structure 12 and electrically connected to the graphene wires 14.

On the source electrode 34, the channel 32 and the drain electrode 36 of the n-TFT 30 and the source electrode 44, the channel 42 and the drain electrode 46 of the p-TFT 40, a gate insulation film 37 formed of, e.g., $Al_2O_3$ is formed.

The film thickness of the gate insulation film may be, e.g., 0.5-100 nm and specifically is preferably 1-10 nm.

On the gate insulation film 37 above the channel 32 of the n-TFT, a gate electrode 38 formed of, e.g., copper is formed, and a gate electrode 48 formed of, e.g., copper is formed on the gate insulation film 37 above the channel of the p-TFT 40.

On the left side of the gate electrode 38 of the n-TFT 30, a wire 39 of the same layer as the gate electrode 38 is formed, and on the right side of the gate electrode 48 of the p-TFT 40, a wire 49 of the same layer as the gate electrode 48 is formed.

The film thickness of the gate electrode 38 and the wire 39 of the n-TFT 49 and the film thickness of the gate electrode 48 and the wire 49 of the p-TFT 40 may be, e.g., 0.5-500 nm and specifically are preferably 1-50 nm.

On the gate insulation film 37, an insulation film 50 of, e.g., silicon oxide film.

An inter-layer insulation film 52 is formed on the gate electrode 38, the wire 39 of the n-TFT 30, the gate electrode 48, the wire 49 of the gate electrode 48, and the insulation film 50.

The inter-layer insulation film 52 is formed of, e.g., silicon oxide film.

The film thickness of the inter-layer insulation film 52 may be, e.g., 1-10000 nm and specifically, is, preferably e.g., 2-200 nm.

(Method of Manufacturing the Semiconductor Device)

The method of manufacturing the semiconductor device according to this embodiment will be described with reference to FIGS. 2A through 6C.

The semiconductor device to be manufactured by this embodiment is a semiconductor device including a wiring structure of graphene wires and nanotube plugs formed on a substrate, and an element structure of, e.g., CMOS formed on the wiring structure.

Figure 2A:
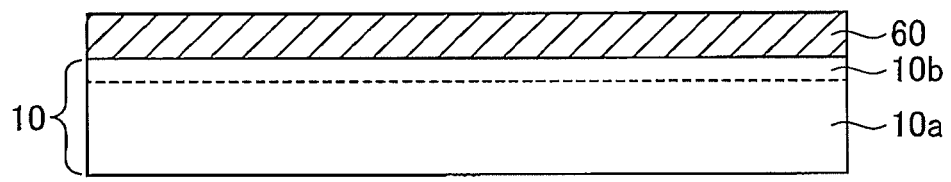
FIGS. 2A, 2B and 2C are sectional views of the semiconductor device in the steps of the semiconductor manufacturing method according to the first embodiment, which illustrate the method (Part 1)

First, the silicon substrate 10 with an oxide film is prepared (FIG. 2A).

The silicon substrate 10 with an oxide film includes, e.g., an about 380 μm-thickness silicon substrate 10a and an about 90 nm-thickness silicon oxide film 19b formed on the silicon substrate 10a.

Next, a multi-layer graphene film 60 which has been synthesized on another substrate (not illustrated) is transferred to the silicon substrate 10 with the oxide film (FIG. 2A).

The film thickness of the multi-layer graphene film 60 may be, e.g., 0.1-500 nm and specifically is preferably 1-20 nm.

Figure 2B:
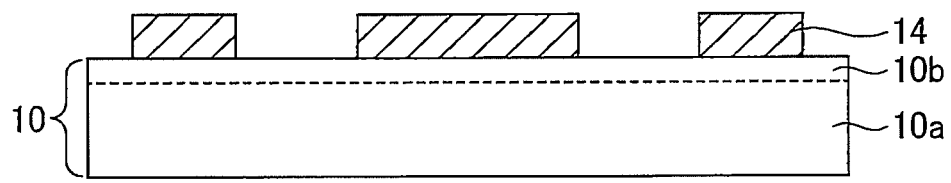

Then, the multi-layer graphene film 60 is patterned by photolithography, electron beam lithography or others to formed the graphene wiring 14 (FIG. 2B).

At this time, the graphene wiring 14 may be made resistive by intercalation.

The sample is loaded in an atmosphere of an oxidizer, e.g., an oxidation atmosphere containing iron chloride using anhydrous iron chloride ($FeCl_3$), e.g., at 310 C in a vacuum of $1\times10^{-2}$ pascal for e.g., 12-24 hours, and the graphene wires 14 are intercalated.

The wire length of the graphene wiring 14 formed of the multi-layer graphehe film 60 is, e.g., 0.5-10000 nm, and the wire width is, e.g., 0.5-500 nm, the wire thickness is, e.g., 0.1-500 nm.

Specifically, it is preferable that the wire length of the graphene wires 14 formed of the multi-layer graphene is, e.g., 50-5000 nm, the wire width is, e.g., 1-20 nm, and the wire thickness is, e.g., 1-20 nm.

Figure 2C:
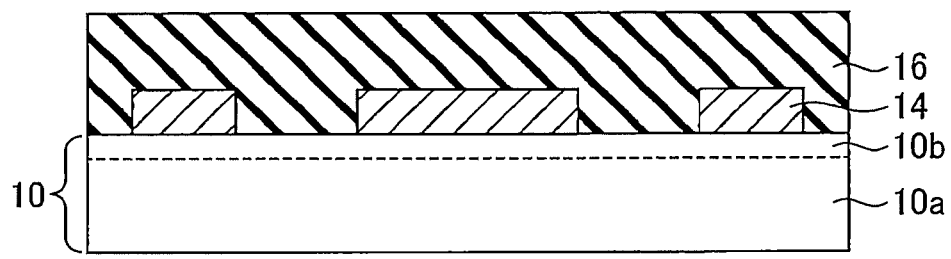

Next, the inter-layer insulation film 16 is formed on the entire surface (FIG. 2C).

The inter-layer insulation film 16 is formed by, e.g., coating SOG (Spin-on-Glass) or others by spin coating.

As required, the upper surface of the inter-layer insulation film 16 may be planarized by chemical mechanical polishing (CMP).

Figure 3A:
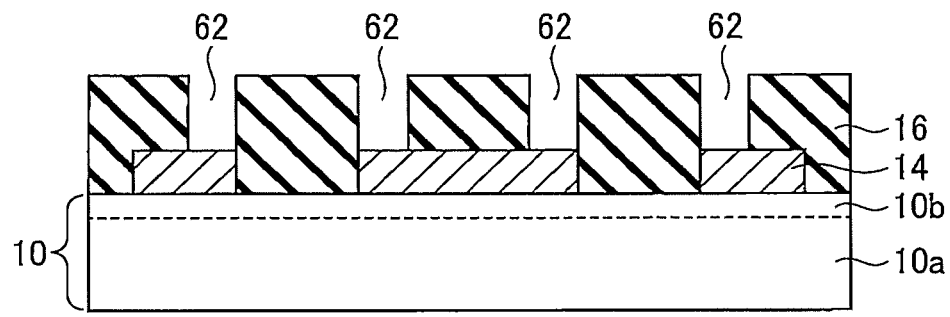
FIGS. 3A, 3B and 3C are sectional views of the semiconductor device in the steps of the semiconductor manufacturing method according to the first embodiment, which illustrate the method (Part 2)

Then, plug holes 62 are formed in the inter-layer insulation film 16 down to the graphene wires 14 by photolithography, electron beam lithography or others (FIG. 3A).

Figure 3B:
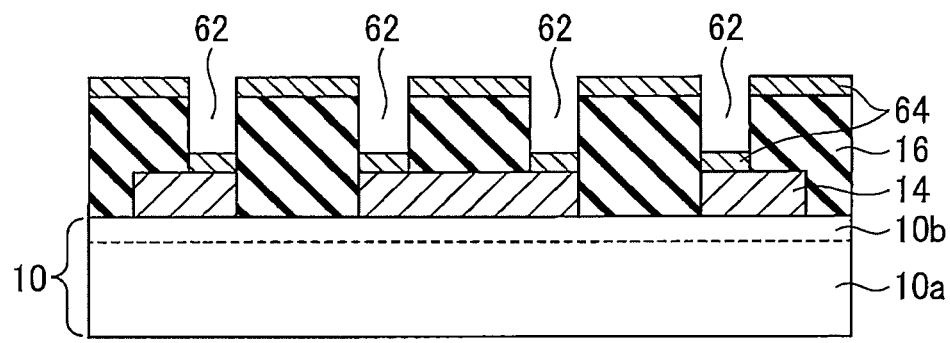

Then, a metal thin film 64 to be the catalyst for the carbon nanotube is formed by, e.g., sputtering on the entire surface, i.e., on the inter-layer insulation film 16 and on the graphene wires 14 in the plug holes 62 (FIG. 3B).

The catalyst for the metal thin film 64 is, e.g., bi-layer film of cobalt and titanium.

Either of the cobalt and the titanium may be upper, but preferably, the cobalt is upper.

The film thickness of the cobalt of the metal thin film 64 is, e.g., 2 nm, and the film thickness of the titanium is, e.g., 1 nm.

The film thickness of the cobalt may be, e.g., 0.5-10 nm and specifically, is preferably, e.g., 1-3 nm.

The film thickness of the titanium can be, e.g., 0.1-50 nm and specifically, is preferably 0.5-2 nm.

Figure 3C:
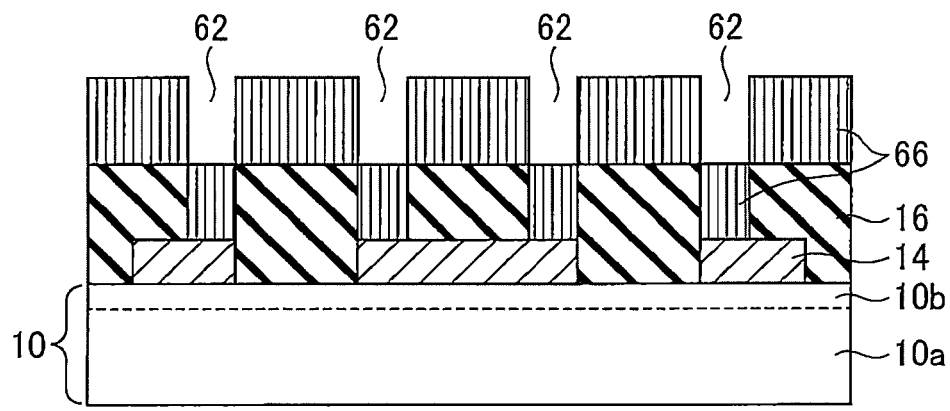

Next, carbon nanotube 66 is synthesized on the metal thin film 64 (FIG. 3C). For example, chemical vapor deposition (CVD) is used.

As the raw material gas, the mixed gas of acetylene and argon mixed by 1 vs. 9, and argon gas are used.

The carbon nanotube is grown at the flow rate of 50 sccm of the mixed gas, the flow rate of 950 sccm of the argon gas, under the total pressure of 1 kPa and at the substrate temperature of 850° C.

Figure 4A:
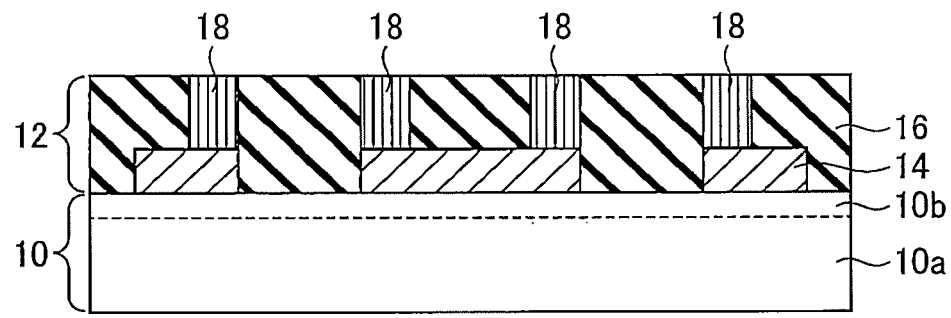
FIGS. 4A, 4B and 4C are sectional views of the semiconductor device in the steps of the semiconductor manufacturing method according to the first embodiment, which illustrate the method (Part 3)

Next, the carbon nanotube 66 on the inter-layer insulation film 16, and the inter-layer insulation film are polished to planarize the upper surface by chemical mechanical polishing CMP (FIG. 4A).

It is possible that before the CMP is made, SPG (Spin-on-Glass or others is buried in the gas between the carbon nanotube bundles 66 by spin coating to secure the carbon nanotube bundles 66.

The material to be buried in can be not only an insulation material but also a conductive material, e.g., a metal such as copper, or others.

Thus, on the silicon substrate 10 with the oxide film, the wiring structure 12 of the graphene wires 14 and the carbon nanotube plugs 18 is formed.

Figure 4B:
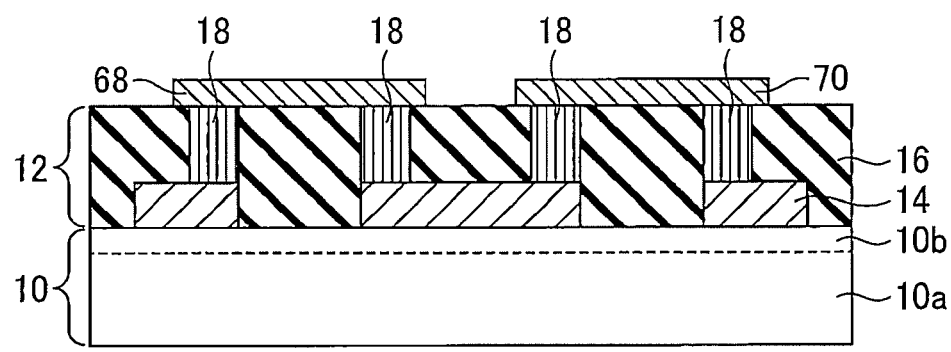

Next, an InGaAs layer 68 patterned in the channel configuration in the left side region for the n-TFT 30 to be formed in, and in the right side region for the p-TFT to be formed in, a Ge layer 70 patterned in the channel configuration is formed (FIG. 4B).

Figure 4C:
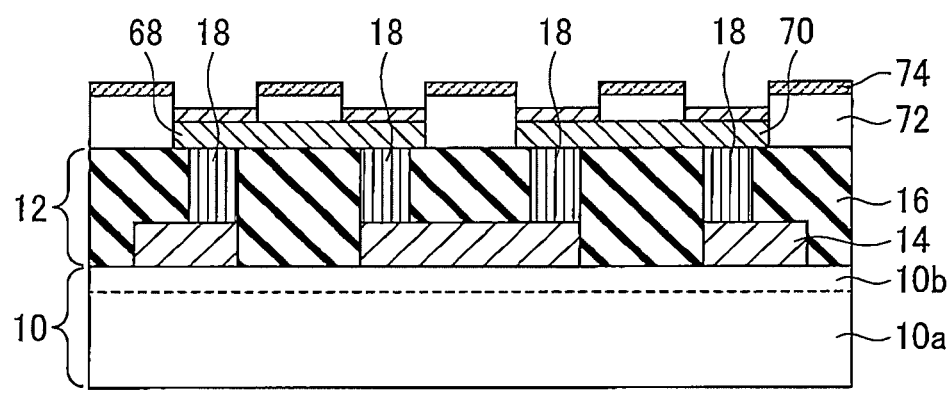

Next, a resist 72 which is so patterned to open the regions for the source electrode and the drain electrode, of the n-TFT 30 to be formed in and to open the regions for the source electrode and the drain electrode, of the p-TFT 40 to be formed in is formed (FIG. 4C).

Next, a Ni layer 74 is deposited on the entire surface with, e.g., a vapor deposition system or others (FIG. 4C).

The film thickness of the nickel layer 74 may be 2-100 nm and specifically, is preferably 1-10 nm.

Figure 5A:
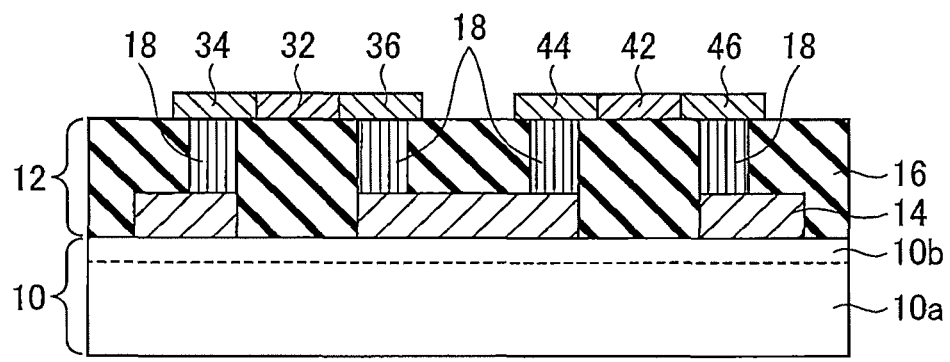
FIGS. 5A, 5B and 5C are sectional views of the semiconductor device in the steps of the semiconductor manufacturing method according to the first embodiment, which illustrate the method (Part 4)

Then, the resist film 72 is released, and then the sample is heated to, e.g., about 300 C, whereby the InGaAs layer 68 and the Ni layer 74 in the n-TFT 30 are alloyed to form the source electrode 34 and the drain electrode 36 of the InGaAs—Ni alloy while the Ge layer 70 and the Ni layer in the p-TFT 40 are alloyed to form the source electrode 44 and the drain electrode 46 of the Ge—Ni alloy (FIG. 5A).

The Ni, and the source and the drain materials are subjected to heat processing, whereby the carbon nanotube, which is the plug material is also alloyed with the Ni, which facilitates the interfacial junction.

To advance this effect, Ni may be evaporated on the nanotube bundles in advance. Co or others in place of Ni can produce the same effect.

Figure 5B:
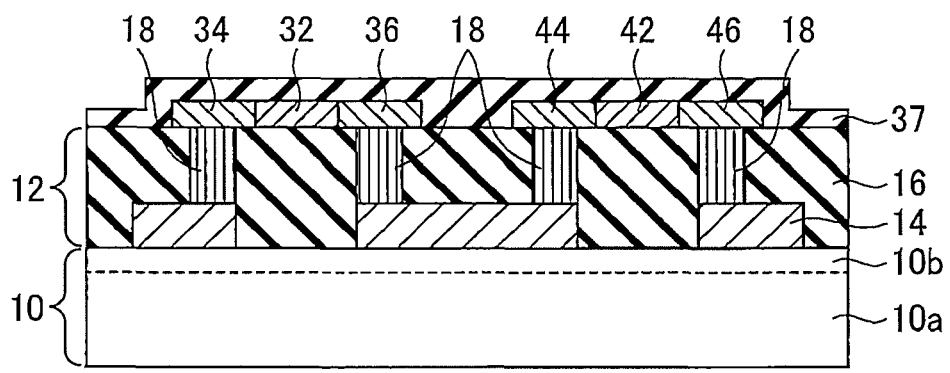

Next, on the entire surface an about 5 nm-thickness alumina ($Al_2O_3$) is deposited by, e.g., atomic layer deposition (ALD) to form the gate insulation film 37 (FIG. 5B).

Then, the insulation film 50 of silicon oxide film is formed on the entire surface.

Figure 5C:
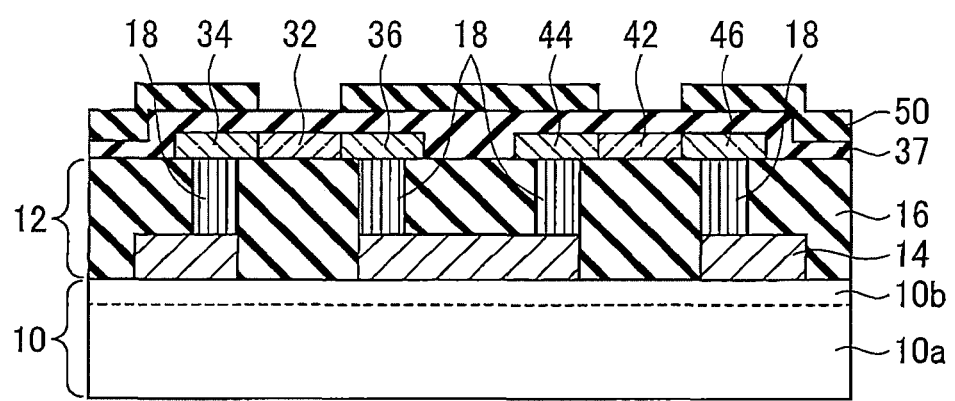

Then, the insulation film 50 is so patterned to open the regions for the gate electrode of the n-TFT, the gate electrode of the p-TFT and the other wires to be formed in (FIG. 5c).

Figure 6A:
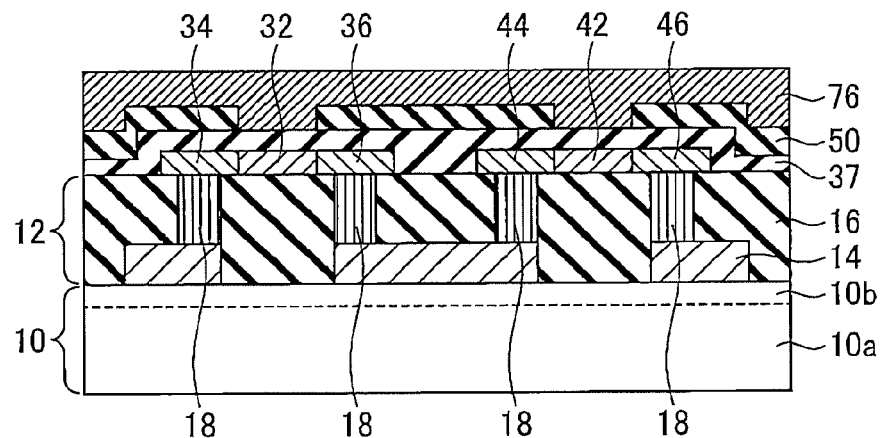
FIGS. 6A, 6B and 6C are sectional views of the semiconductor device in the steps of the semiconductor manufacturing method according to the first embodiment, which illustrate the method (Part 5)

Next, a copper layer 76 is formed on the entire surface by plating or others (FIG. 6A).

The film thickness of the copper layer 76 is, e.g., 100 nm.

Figure 6B:
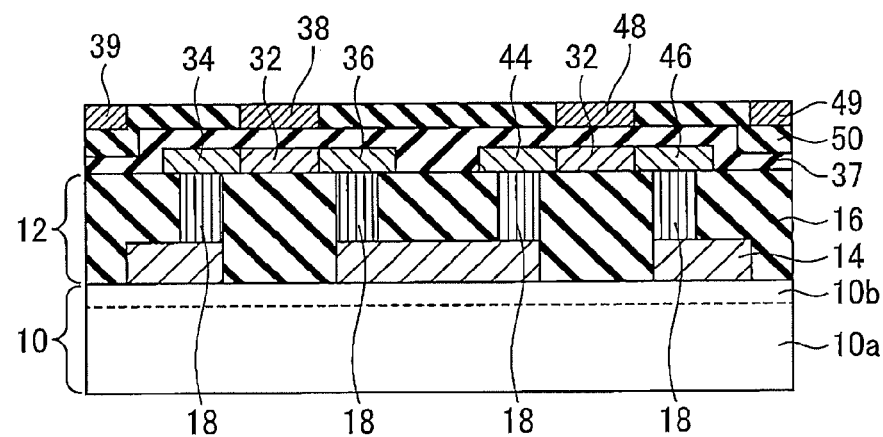

Then, the copper layer 76 and the insulation film 50 are polished by chemical mechanical polishing (CMP) to planarize the upper surface (FIG. 6B).

Thus, the gate electrode 38 of the n-TFT 30, the gate electrode 48 of the p-TFT 40 and the wires 39, 49 are formed (FIG. 6B).

Figure 6C:
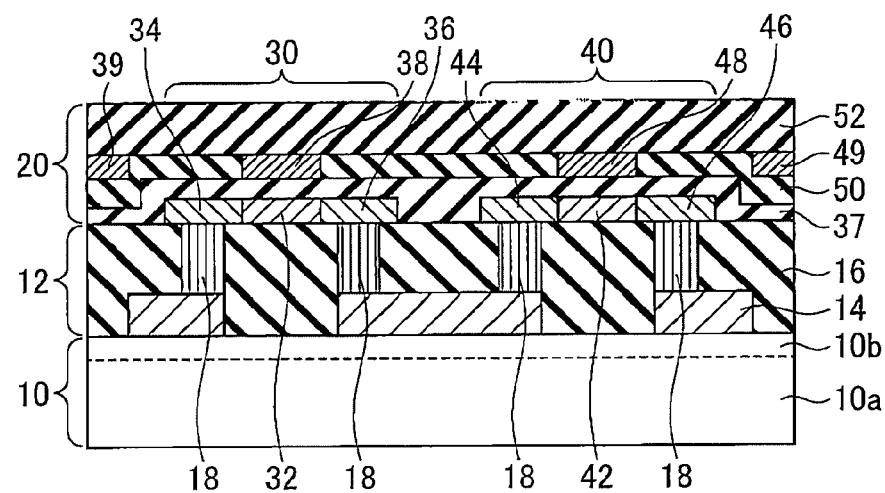

Then, the inter-layer insulation film 52 is formed on the entire surface (FIG. 6C).

The inter-layer insulation film 52 is formed by, e.g., coating SOG (Spin-on-Glass) or others by spin coating.

As required, the upper surface of the inter-layer insulation film 52 may be planarized by chemical mechanical polishing (CMP).

As described above, the semiconductor device including the wiring structure 12 formed on the silicon substrate 10 with the oxide film, and the element structure 20 of CMOS formed on the wiring structure is manufactured.

[b] A Second Embodiment

The semiconductor device according to a second embodiment and the method of manufacturing the semiconductor device will be described with reference to FIGS. 7 through 12C.

Figure 7:
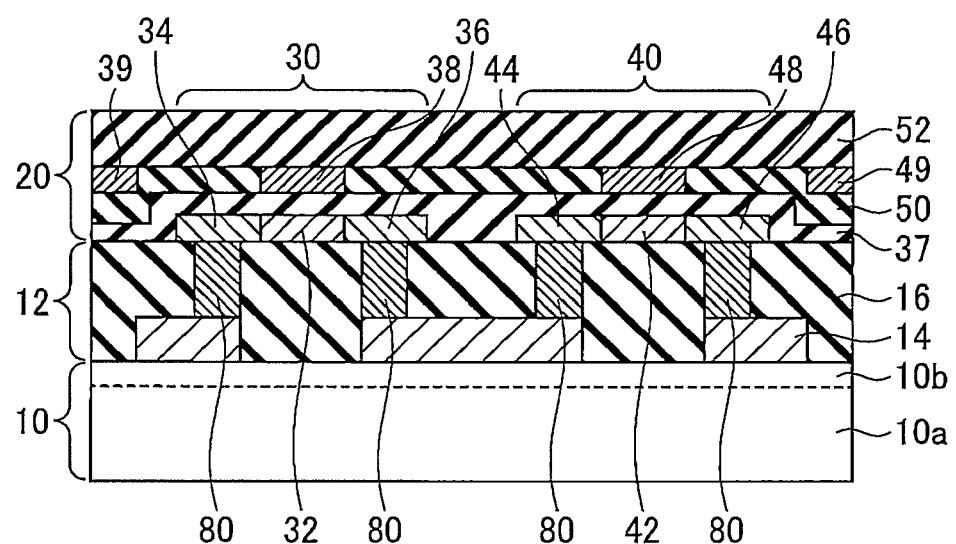
FIG. 7 is a view of the semiconductor device according to a second embodiment.

FIG. 7 is a view of the semiconductor device according to the second embodiment, and FIGS. 8 to 12 are sectional views of the semiconductor device according to the second embodiment in the steps of the method of manufacturing the semiconductor device, which illustrate the manufacturing method.

(Semiconductor Device)

The semiconductor device according to this embodiment will be described with reference to FIG. 1.

The semiconductor device according to this embodiment is a semiconductor device including a wiring structure of graphene wires and nanotube plugs formed on a substrate, and an element structure of, e.g., CMOS formed on the wiring structure.

On a silicon substrate 10 with an oxide film, a wiring structure 12 as first layer wires is formed, and on the wiring structure 12, an element structure 20 wired by the first layer wires is formed.

The silicon substrate with an oxide film 10 is, e.g., an about 380 μm-thickness silicon substrate 10a with an about 90 mm-thickness silicon oxide film 10b formed on.

The wiring structure 12 includes graphene wires 14 formed o the silicon substrate 10 with an oxide film, an inter-layer insulation film 16 formed on the graphene wires 14 and tungsten plugs 80 contacting the graphene wires 14 and the element structure 20.

The graphene wires 14 are formed of, e.g., a multi-layer graphene film.

The wire length of the graphene wires 14 formed of the multi-layer graphene film may be, e.g., 0.5-10000 nm, the wire width may be, e.g., 0.5-500 nm, and the wire thickness many be, e.g., 0.1-500 nm.

Specifically, it is preferable that the wire length of the graphene wires 14 formed of the multi-layer graphene film is, e.g., 50-5000 nm, the wire width is, e.g., 1-20 nm, and the wire thickness is, e.g., 1-20 nm.

The inter-layer insulation film 16 is formed of, e.g., silicon oxide film.

The film thickness of the inter-layer insulation film 16 may be, e.g., 1-10000 nm and specifically, is preferable, e.g., 2-200 nm.

The tungsten plugs 80 are formed of tungsten.

The length of the tungsten plugs 80 may be, e.g., 1-500 nm, and the diameter may be, e.g., 0.5-500 nm, and specifically, it is preferable that the length of the tungsten plugs 80 is, e.g., 1-100 nm, and the diameter is, e.g., 1-50 nm.

The element structure 20 formed on the wiring structure 12 is of CMOS structure including, e.g., an n-TFT on the left side of FIG. 1, and a p-TFT 40 on the right side of FIG. 1.

The n-TFT 30 includes a source electrode 34 and a drain electrode 36 formed of InGaAs—Ni alloy formed on both sides of a channel 32 formed of InGaAs.

The p-TFT 40 includes a source electrode 44 and a drain electrode 46 formed of Ge—Ni alloy formed on both sides of a channel 42 formed of Ge.

The channel length of the channel of the n-TFT 30 and the channel 42 of the p-TEFT 40 may be, e.g., 0.5-500 nm and specifically is preferably, e.g., 1-50 nm.

The film thickness of the source electrode 34, the channel 32 and the drain electrode 36 of the n-TFT 30 may be, e.g., 0.5-500 nm and specifically is preferably, 1-50 nm.

The film thickness of the source electrode 44, the channel 42 and the drain electrode 46 of the p-TFT 40 may be, e.g., 0.5-500 nm and specifically, is preferably 1-50 nm.

The source electrode and the channel 32 of the n-TFT 30, and the source electrode 44 and the drain electrode 46 of the p-TFT 40 are contacted to the tungsten plugs 80 of the wiring structure 12 to be electrically connected to the graphene wires 14.

On the source electrode 34, the channel 32 an the drain electrode 36 of the n-TFT 30 and the source electrode 44, the channel 42 and the drain electrode 46 of the p-TFT 40, a gate insulation film 37 of, e.g., $Al_2O_3$ is formed.

The film thickness of the gate insulation film may be, e.g., 0.5-100 nm and specifically, is preferably 1-10 nm.

On the gate insulation film 37 above the channel of the n-TFT 30, a gate electrode 38 formed of, e.g., copper is formed, and on the gate insulation film 37 above the channel 42 of the p-TFT 40, a gate electrode 48 of, e.g., copper is formed.

On the left side of the gate electrode 38 of the n-TFT, a wire 39 of the same layer as the gate electrode 38 is formed, and on the right side of the gate electrode of the p-TFT 40, a wire 49 of the same layer as the gate electrode is formed.

The film thickness of the gate electrode 38 and the wire 39 of the n-TFT 30 and the gate electrode 48 and the wire 49 of the p-TFT 40 may be, e.g., 0.5-500 nm and specifically is preferably 1-50 nm.

On the gate insulation film 37, an insulation film 50 of, e.g., silicon oxide film is formed.

An inter-layer insulation film 52 is formed on the gate electrode 38 and the wire 39 of the n-TFT 30, the gate electrode 48 and the wire 49 of the p-TFT, and the insulation film 50.

The inter-layer insulation film 52 is formed of, e.g., silicon oxide film.

The thickness of the inter-layer insulation film may be, e.g. 1-10000 nm and specifically is preferably, eg., 2-200 nm.

(Method of Manufacturing the Semiconductor Device)

The method of manufacturing the semiconductor device according this embodiment will be described with reference to FIGS. 8A through 12C.

The semiconductor device to be manufactured by this embodiment includes a wiring structure of a graphene wires and nanotube plugs formed on a substrate, and a device structure of, e.g., CMOS formed on the wiring structure.

Figure 8A:
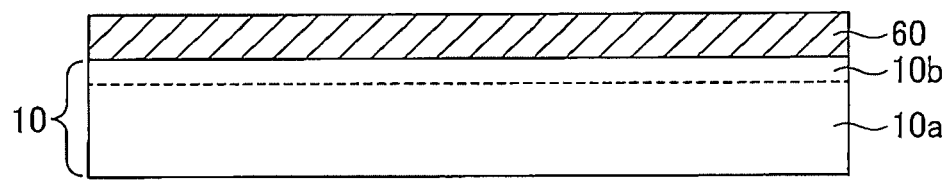
FIGS. 8A, 8B and 8C are sectional views of the semiconductor device in the steps of the semiconductor manufacturing method according to the second embodiment, which illustrate the method (Part 1)

First, the silicon substrate 10 with an oxide film 10 is prepared (FIG. 8A).

The silicon substrate with an oxide film is, e.g., an about 380 μm-thickness silicon substrate 10a with an about 90 nm-thickness silicon oxide film 10b formed on.

Next, the multi-layer graphene film 60 synthesized on another substrate (not illustrated) is transferred to the silicon substrate 10 with an oxide film (FIG. 8A).

The film thickness of the multi-layer graphene film 60 may be, e.g., 0.1-500 nm and specifically is preferably 1-20 nm.

Figure 8B:
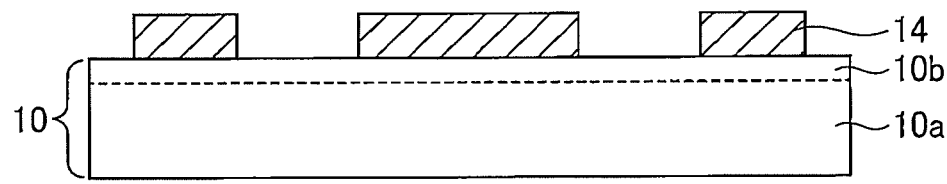

Next, the multi-layer graphene film 60 is patterned by photolithography, electron beam lithography or others to form the graphene wires 14 (FIG. 8B).

At this time, the graphene wires 14 may be made low resistive by intercalation.

The sample is loaded in an oxidation atmosphere of an oxidizer, e.g., an oxidation atmosphere containing, e.g., iron chloride using iron chloride ($FeCl_3$), e.g., at 310 C, in a vacuum of $1\times10^{-2}$ pascal, e.g., for 12-24 hours, and the graphene wires 14 are intercalated.

The wire length of the graphene wires 14 formed of the multi-layer graphene 60 is, e.g., 0.5-10000 nm, the wire width is, e.g., 0.5-500 nm, and the wire thickness is, e.g., 0.1-500 nm.

Specifically, it is preferable that the wire length of the graphene wires 14 formed of the multi-layer graphene film 60 is, e.g., 50-5000 nm, the wire width is, e.g., 1-2 nm, and the wire thickness is, e.g., 1-20 nm.

Figure 8C:
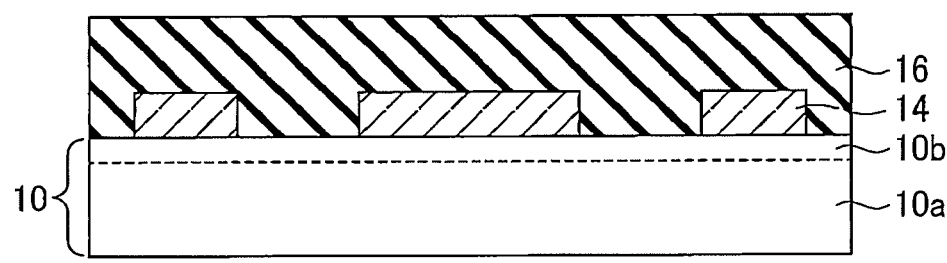

Next, the inter-layer insulation film 16 is formed on the entire surface (FIG. 8C).

The inter-layer insulation film 16 is formed, e.g., by coating SO (spin-on-lass) by spin coating.

As required, the upper surface of the inter-layer insulation film 16 may be planarized by CMP (chemical mechanical polishing).

Figure 9A:
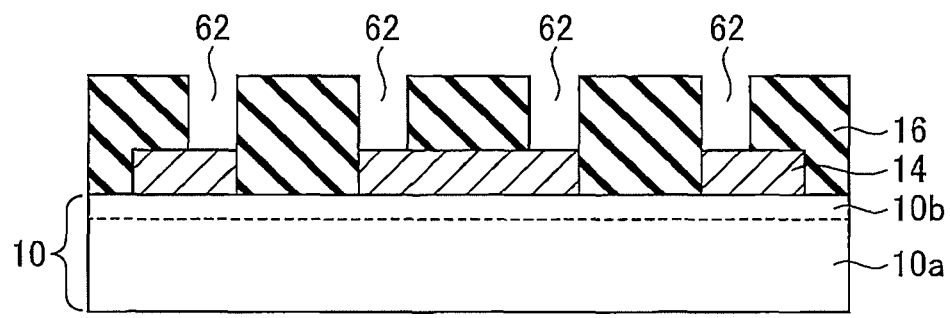
FIGS. 9A, 9B and 9C are sectional views of the semiconductor device in the steps of the semiconductor manufacturing method according to the second embodiment, which illustrate the method (Part 2)

Next, the plug holes 62 are formed in the inter-layer insulation film 16 down to the graphene wires 14 by photolithography and electron beam lithography (FIG. 9A).

The diameter of the plug holes 62 may be, e.g., 5-500 nm and specifically, is preferably, e.g., 1-50 nm.

Figure 9B:
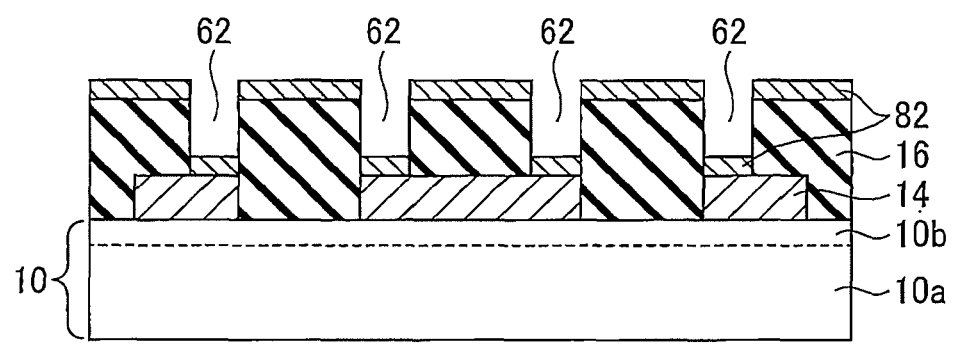

Next, on the entire surface, a seed layer 82 of tungsten is formed on the inter-layer insulation film 16 and on the graphene wires 14 in the plug holes 62 by, e.g., sputtering (FIG. 9B).

The seed layer 82 is tungsten film.

The film thickness of the seed layer 82 is, e.g., 1 nm.

The film thickness of the seed layer 82 may be 0.2-10 nm and specifically is preferably, e.g., 0.5-2 nm.

Figure 9C:
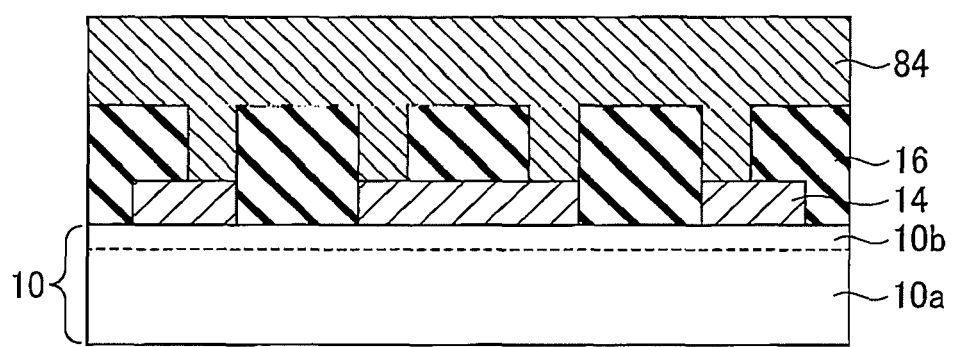

Next, a tungsten layer 84 is formed on the seed layer 82 (FIG. 9C).

Chemical vapor deposition (CVD) is used.

The tungsten layer 84 is grown by CVD by using tungsten hexafluoride (WFe) as the raw material at a flow rate of 50 sccm of the $WF_6$ gas, at a flow rate of 150 sccm of the argon gas, under a total pressure of 1 kPa and at a substrate temperature of 300 C.

Figure 10A:
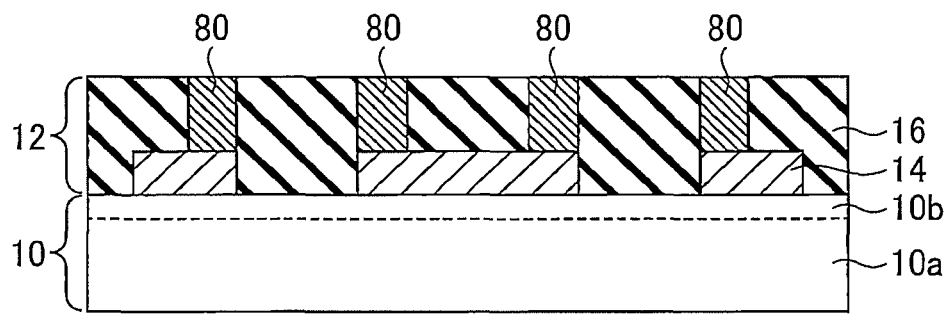
FIGS. 10A, 10B and 10C are sectional views of the semiconductor device in the steps of the semiconductor manufacturing method according to the second embodiment, which illustrate the method (Part 3)

Then, the tungsten layer 84 and the inter-layer insulation film 16 on the inter-layer insulation film 16 are polished chemical mechanical polishing (CMP) to planarize the upper surface (FIG. 10A).

Thus the prescribed wiring structure 12 is formed on the silicon substrate 10 with an oxide film.

Figure 10B:
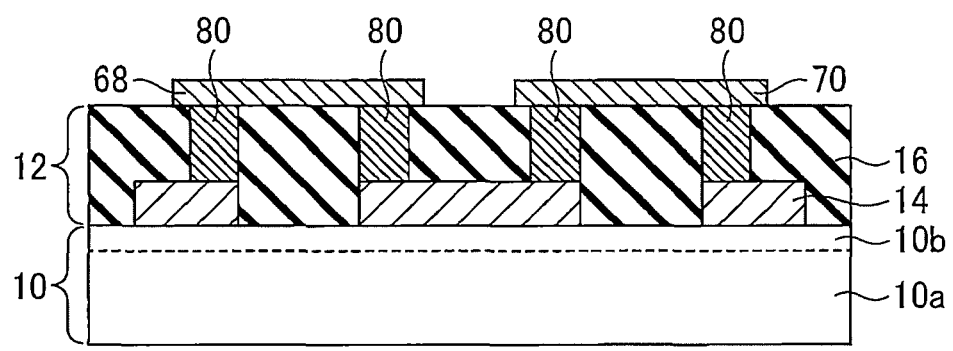

Next, an InGaAs layer 68 patterned in the channel configuration in the left side region for the n-TFT 30 to be formed in and a Ge layer 70 patterned in the channel configuration in the right side region for the p-TFT 40 to be formed in are formed by photolithography and electron beam lithography or others (FIG. 10B).

Figure 10C:
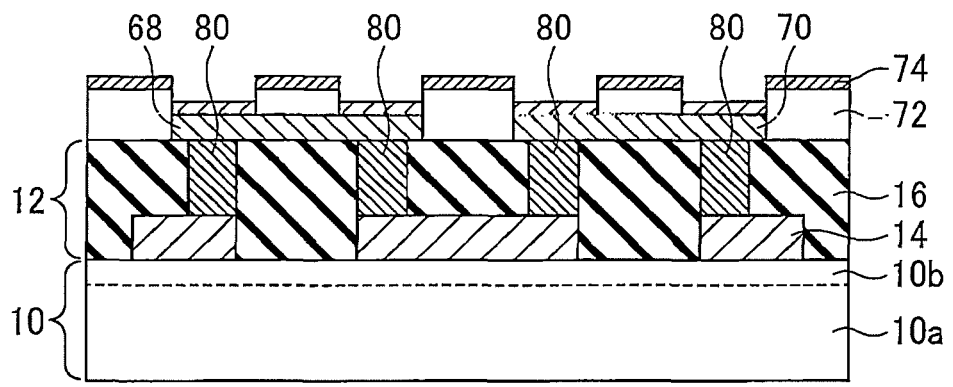

Then, a resist film 72 so patterned to be opened in the regions for the source electrode and the drain electrodes of the n-TFT 30 and opened in the regions for the source electrode and the drain electrode of the p-TFT 40 to be formed in is formed (FIG. 10C).

Next, a Ni layer 74 is deposited on the entire surface by, e.g., vapor deposition system or others (FIG. 10C).

The film thickness of the Ni layer 74 may be, e.g., 0.2-100 nm and specifically, is preferably, e.g., 1-10 nm.

Figure 11A:
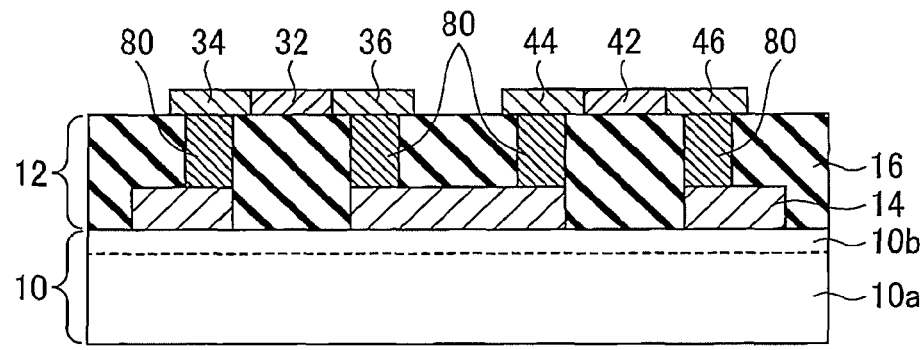
FIGS. 11A, 11B and 11C are sectional views of the semiconductor device in the steps of the semiconductor manufacturing method according to the second embodiment, which illustrate the method (Part 4)

Then, the resist film 72 is released, and then the sample is heated to, e.g., about 300 C to alloy the InGaAs layer 68 and the Ni layer 74 of the n-TFT 30 and form the source electrode 34 and the drain electrode 36 of the InGaAs—Ni alloy and while alloying the Ge layer 70 and the Ni layer 74 and form the source electrode 44 and the drain electrode 46 of the Ge—Ni alloy (FIG. 11A).

Figure 11B:
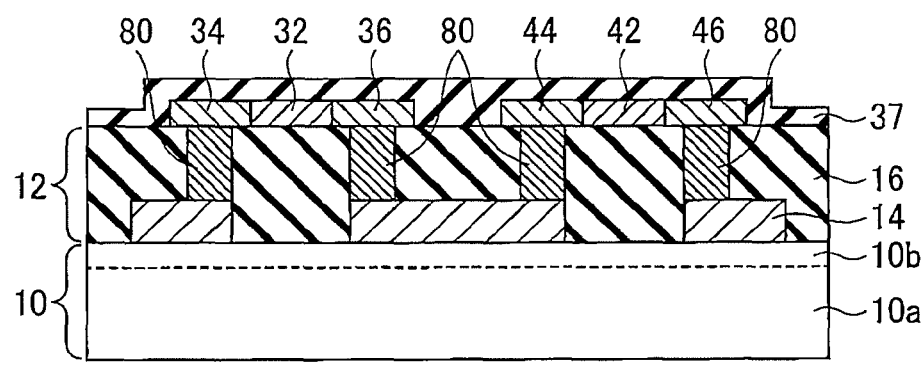

Next, on the entire surface, an about 5 nm-thickness alumina ($Al_2O_3$) is deposited by, e.g., atomic layer deposition (ALD) to form the gate insulation film 37 (FIG. 11B).

Next, on the entire surface, the insulation film 50 of silicon oxide film is formed.

Figure 11C:
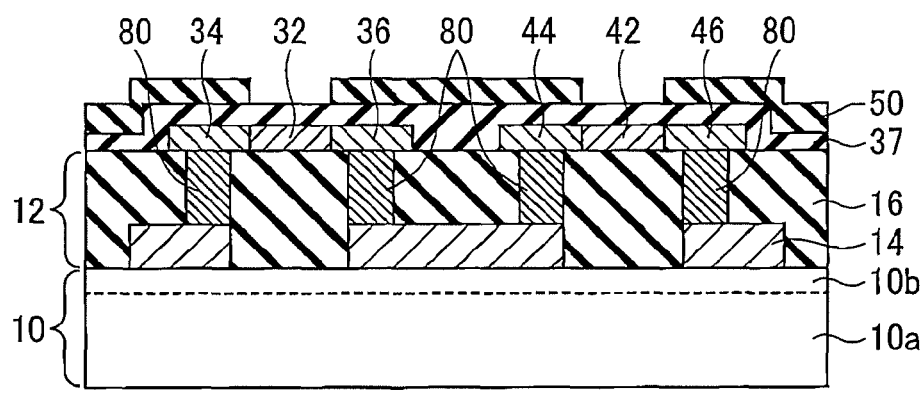

Then, the insulation film 50 so patterned to open the regions for the gate electrode of the n-TFT 30, the gate electrode of the p-TFT 40 and other wires to be formed in (FIG. 11C).

Figure 12A:
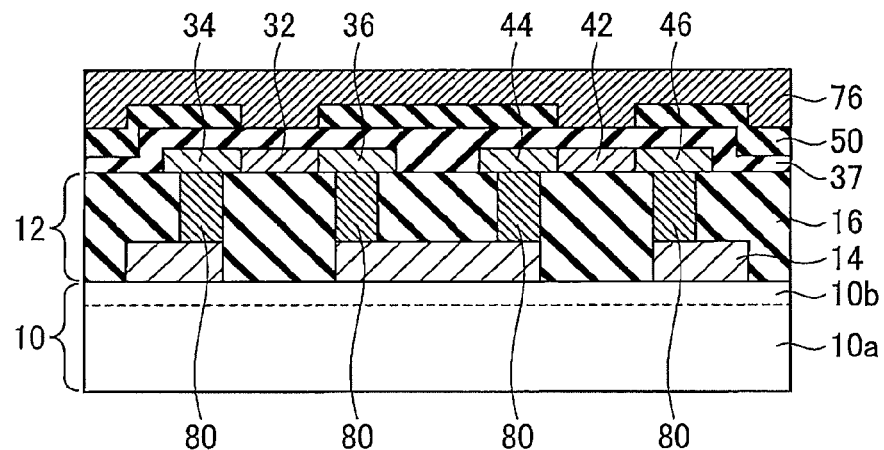
FIGS. 12A, 12B and 12C are sectional views of the semiconductor device in the steps of the semiconductor manufacturing method according to the second embodiment, which illustrate the method (Part 5)

Next, on the entire surface, the copper layer 76 is formed by plating or others (FIG. 12A).

The film thickness of the copper layer 76 is, e.g., 100 nm.

Figure 12B:
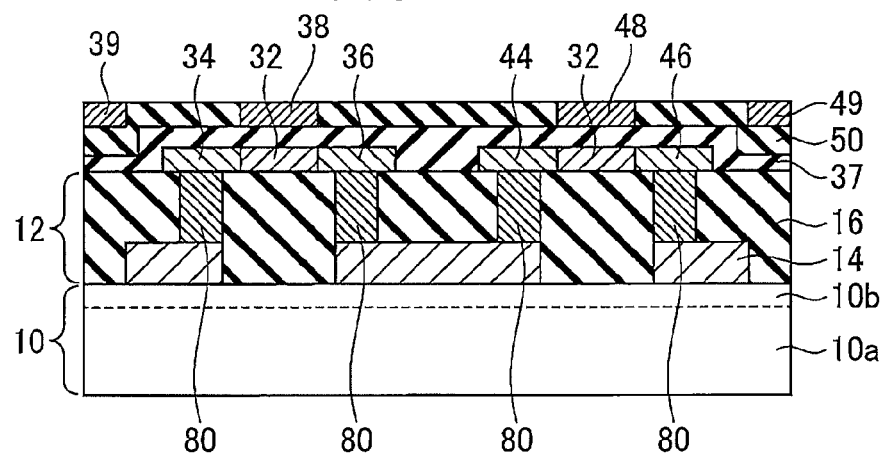

Next, the copper layer 76 and the insulation film 50 are polished by chemical mechanical polishing (CMP) to planarize the upper surface (FIG. 12B).

Thus, the gate electrode 38 of the n-TFT 30, the gate electrode 48 of the p-TFT and the wires 39, 49 are formed (FIG. 12B).

Figure 12C:
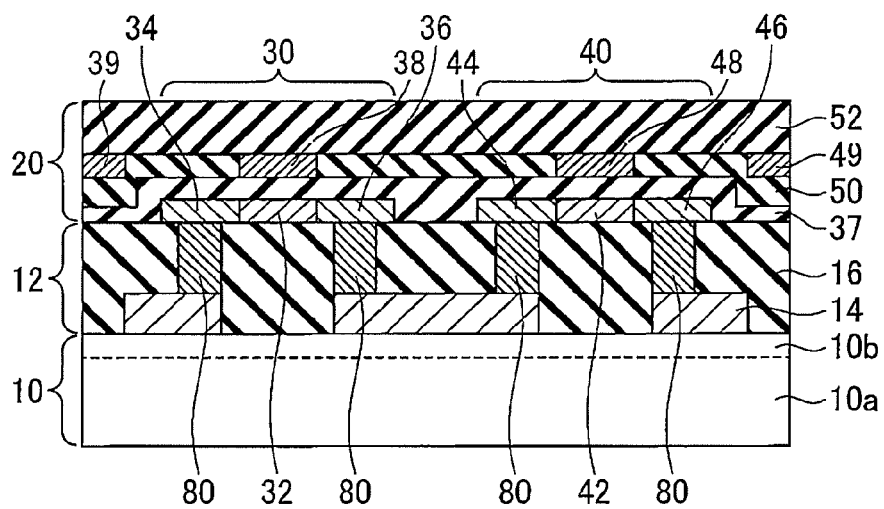

Next, the inter-layer insulation film 52 is formed on the entire surface (FIG. 12C).

The inter-layer insulation film 52 is formed, e.g., by coating SOG (spin-on-glass) or others.

As required, the upper surface of the inter-layer insulation film 52 may be planarized by chemical mechanical polishing (CMP).

As described above, the semiconductor device including the wiring structure 12 is formed on the silicon substrate 10 with an oxide film, and the element structure of CMOS formed on the wiring structure is manufactured.

[c] Third Embodiment

The semiconductor device according to a third embodiment and the method of manufacturing the semiconductor device will be described with reference to FIGS. 13 through 17.

Figure 13:
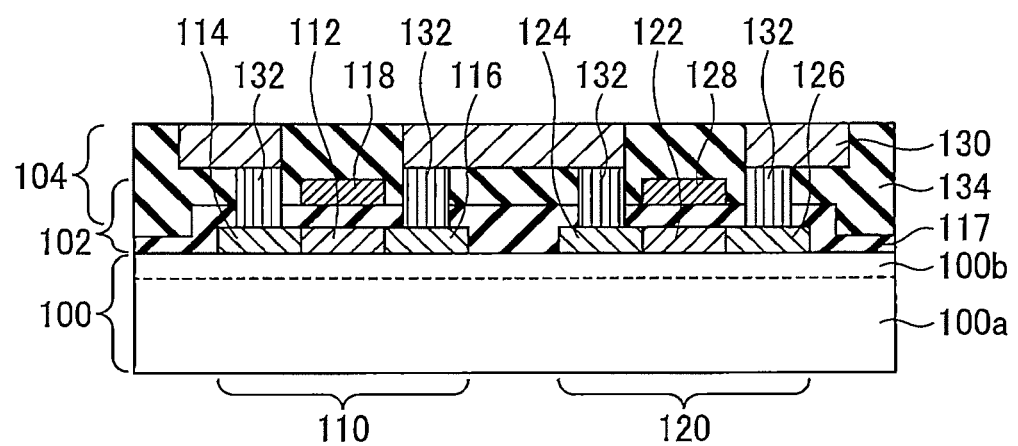
FIG. 13 is a view of the semiconductor device according to a third embodiment.

FIG. 13 is a view of the semiconductor device according to the third embodiment, and FIGS. 14 to 17 are sectional views of the semiconductor device according to the third embodiment in the steps of the method of manufacturing the semiconductor device, which illustrate the manufacturing method.

(Semiconductor Device)

The semiconductor device according to a third embodiment will be described with reference to FIG. 13.

The semiconductor device according to this embodiment includes an element structure of, e.g., CMOS formed on a substrate, and a wiring structure of graphene wires and nanotube plugs formed on the element structure.

An element structure 102 of e.g., CMOS is formed on a silicon substrate 10 with an oxide film, and on the element structure 102, a wiring structure 104 as first layer wires is formed.

The silicon substrate 100 with an oxide film is, e.g., an about 380 μm-thickness silicon substrate 100, and an about 90 nm-thickness silicon oxide film 100b formed on the silicon substrate 100a.

The element structure 102 formed on the silicon substrate 100 with an oxide film is of CMOS structure, e.g., including an n-TFT 110 on the left side of FIG. 13 and a p-TFT 120 on the right side of FIG. 13.

The n-TFT 110 includes a source electrode 114 and a drain electrode 116 of InGaAs—Ni alloy formed on both sides of a channel 112 formed of, e.g., Ge.

The n-TFT 120 includes a source electrode 124 and a drain electrode 126 of Ge—Ni alloy formed on both sides of a channel 122 formed of, e.g., Ge.

The channel length of the channel 112 of the n-TFT and the channel 122 of the p-TFT may be, e.g., 0.5-500 nm and specifically is preferably 1-50 nm.

The film thickness of the source electrode 114, the channel 112 and the drain electrode 116 of the n-TFT 110 may be, e.g., 0.5-500 nm and specifically is preferably 1-50 nm.

The film thickness of the source electrode 124, the channel 12 and the drain electrode 126 of the p-TFT 120 may be, e.g., 0.5-500 nm and specifically is preferably 1-50 nm.

The source electrode 114 and the drain electrode 116 of the n-TFT 110, and the source electrode 124 and the drain electrode 126 of the p-TFT 120 are contacted to the nanotube plugs 132 of the wiring structure 104 to be described later and are electrically connected to the graphene wires 130.

A gate insulation film 117 formed of, e.g., Al2O3 is formed on the source electrode 114, the channel 112 and the drain electrode 116 of the n-TFT 110 and on the source electrode 124, the channel 122 and the drain electrode 126 of the p-TFT 120.

The film thickness of the gate insulation film 117 may be, e.g., 0.5-100 nm and specifically is preferably 1-10 nm.

On the gate insulation film 117 above the channel 112 of the n-TFT 110, a gate electrode 118 of, e.g., copper is formed, and a gate electrode 118 of, e.g., copper is formed on the gate insulation film 117 above the channel 122 of the p-TFT 120.

The film thickness of the gate electrode 118 of the n-TFT 110 and the gate electrode 128 of the p-TFT 120 may be, e.g., 0.5-100 nm and specifically is preferably 1-10 nm.

The wiring structure 104 is formed on the element structure 102 formed on the silicon substrate 100 with an oxide film.

The wiring structure 104 includes the graphene wires 130 and the nanotube plugs 132 contacting the graphene wires 130 and the element structure 102 formed in an inter-layer insulation film 134.

The graphene wires 130 are formed upper in the inter-layer insulation film 134.

The carbon nanotube plugs 132 are extended downward from the graphene wires 130 and contacted respectively to the source region 112s and the drain region 112d of the n-TFT 110 and the source region 122s and the drain region 122d of the p-TFT 120.

The graphene wires 130 are formed of, e.g., multi-layer graphene film.

The wire length of the graphene wires 130 formed of multi-layer graphene film may be, e.g., 0.5-10000 nm, the wire width may be, e.g., 0.5-500 nm, and he wire thickness may be, e.g., 0.1-500 nm.

Specifically, it is preferable that the wire length of the graphene wires 130 formed of multi-layer graphene film is, e.g., 50-5000 nm, the wire width is, e.g., 1-20 nm, and the wire thickness is, e.g., 1-20 nm.

The nanotube plugs 132 are formed of, e.g., carbon nanotube (CNT).

The length of the nanotube plugs 120 formed of carbon nanotube may be, e.g., 1-500 nm, and the diameter may be, e.g., 0.5-500 nm.

Specifically, it is preferable that the length of the nanotube plugs 130 formed of carbon nanotube is, e.g., 1-100 nm, and the diameter is, e.g., 1-50 nm.

The inter-layer insulation film 13 is formed of, e.g., silicon oxide film.

The film thickness of the inter-layer insulation film 134 may be, e.g., 1-10000 nm and specifically is preferably 2-200 nm.

(Method of Manufacturing the Semiconductor Device)

The method of manufacturing the semiconductor device according to this embodiment will be described with reference to FIGS. 14A through 17.

The semiconductor device according to this embodiment includes an element structure of, e.g., CMOS formed on a substrate, and a wiring structure of graphene wires and nanotube plugs formed on the element structure.

Figure 14A:
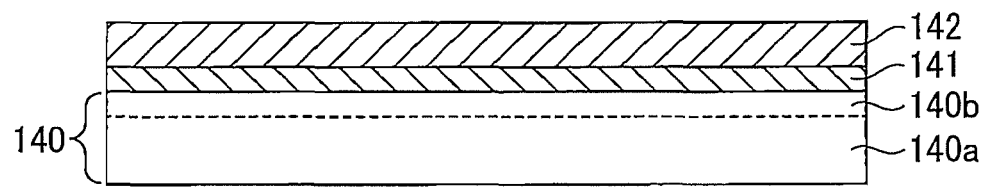
FIGS. 14A, 14B and 14C are sectional views of the semiconductor device in the steps of the semiconductor manufacturing method according to the third embodiment, which illustrate the method (Part 1)

First, the silicon substrate 140 with an oxide film for the multi-layer graphene film to be formed on is prepared (FIG. 14A).

The silicon substrate 140 with an oxide film is prepared separately from the substrate of the semiconductor device according to this embodiment.

The silicon substrate 140 with an oxide film 140 includes, e.g., an about 380 m-thickness silicon substrate 140a and an about 90 nm-thickness silicon oxide film 140b formed on.

Next, on the silicon substrate 140 with an oxide film, a catalyst metal film 141 is formed of a metal to be the catalyst for graphene (FIG. 14A).

As the catalyst metal film 141, an about 200 nm-thickness cobalt film, for example, is deposited on the silicon substrate 140 with an oxide film by sputtering, electron beam deposition or others.

Next, on the catalyst metal film 141, a multi-layer graphene film 142 is synthesized (FIG. 14A).

The multi-layer graphene film 142 is synthesized, e.g., by thermal CVD at 1000 C.

Then, after the multi-layer graphene film 142 has been synthesized, the sample is loaded in a nitrogen atmosphere to be sufficiently degassed under a pressure of, e.g., 10-2 pascal or below for, e.g., 12 hours or more.

Figure 14B:
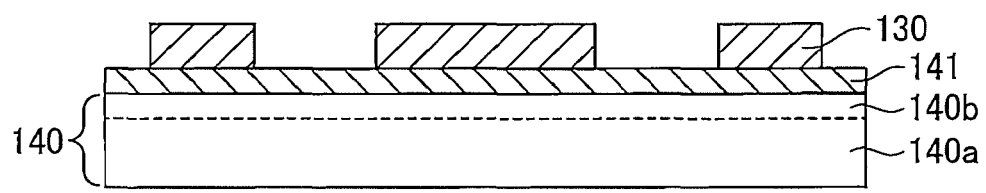

Then, the multi-layer graphene film 142 is patterned by photolithography, electron beam lithography or others to form the graphene wires 130 (FIG. 14B).

The wire length of the graphene wires 142 formed of the multi-layer graphene film 142 may be, e.g., 0.5-10000 nm, the wire width may be, e.g. 0.5-500 nm, and the wire thickness may be, e.g., 0.1-500 nm.

Specifically, it is preferable that the wire length of the graphene wires 130 formed of the multi-layer graphene film 142 is, e.g., 50-5000 nm, the wire width is, e.g., 1-20 nm, and the wire thickness if, e.g., 1-20 nm.

Figure 14C:
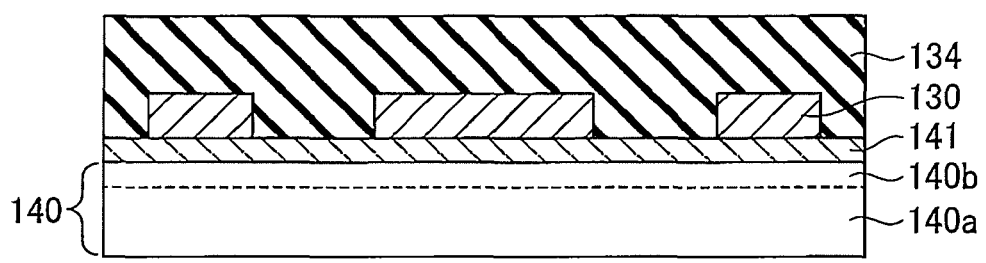

Next, the interlayer insulation film 134 is formed on the entire surface (FIG. 14C).

The inter-layer insulation film 134 is formed by coating SOG (spin-on-glass) or others by spin coating.

As required, the upper surface of the inter-layer insulation film 134 may be planarized by chemical mechanical polishing (CMP).

Figure 15A:
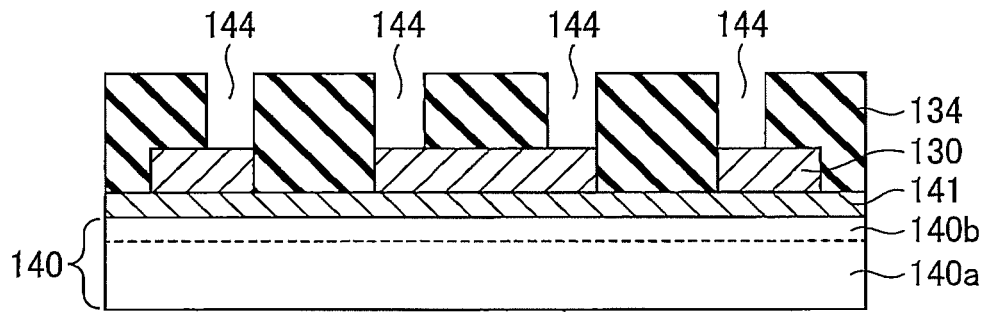
FIGS. 15A, 15B and 15C are sectional views of the semiconductor device in the steps of the semiconductor manufacturing method according to the third embodiment, which illustrate the method (Part 2)

Then, the plug holes 144 are formed in the inter-layer insulation film 124 down to the graphene wires 130 by photolithography, electron beam lithography or others (FIG. 15A).

The diameter of the plug holes 144 may be, e.g., 0.5-500 nm and specifically is preferably, e.g., 1-50 nm.

Figure 15B:
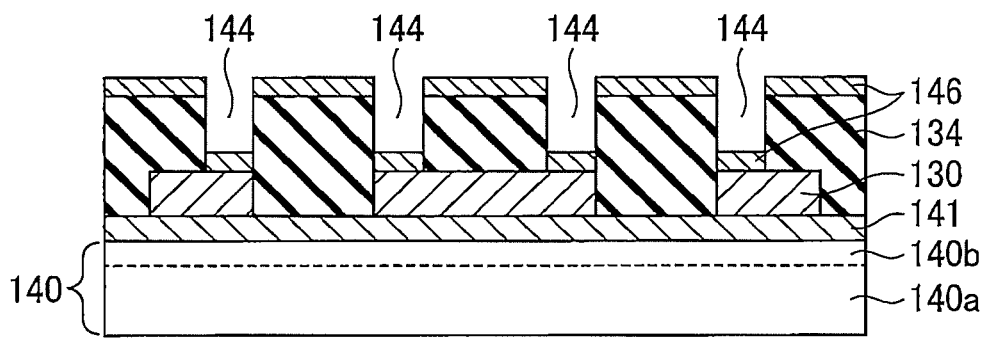

Next, on the entire surface, i.e., on the inter-layer insulation film 134 and on the graphene wires 130 in the plug holes 144, a metal thin film 146 to be the catalyst for carbon nanotube is formed by, e.g., sputtering FIG. 15B.

The metal thin film 146 to be the catalyst is, e.g., bi-layer film of cobalt and titanium.

Either of cobalt and titanium may be upper, but preferably, cobalt is upper.

The film thickness of the cobalt of the metal thin film 146 is, e.g., 2 nm, and the film thickness of the titanium is, e.g., 1 nm.

The film thickness of the cobalt may be, e.g., 0.5-10 nm and specifically, is preferably, e.g., 1-3 nm.

The film thickness of the titanium may be, e.g., 0.1-5 nm and specifically, is preferably, e.g., 0.5-2 nm.

Figure 15C:
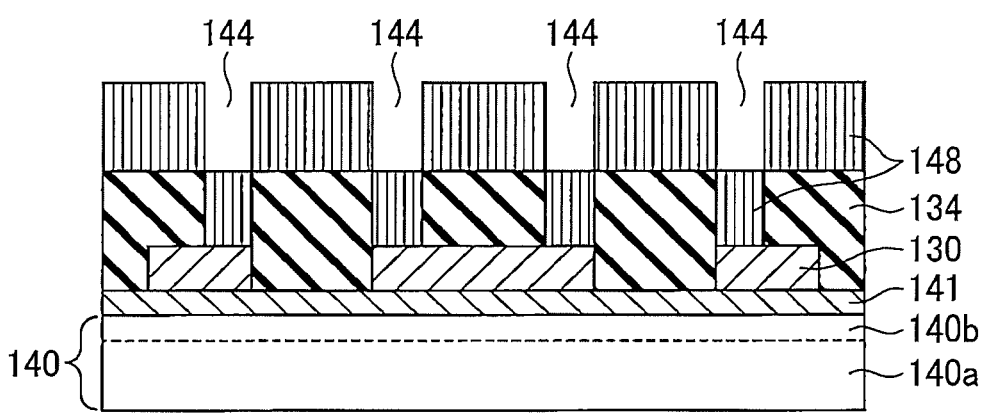

Next, carbon nanotube 148 is formed on the metal thin film 146 (FIG. 15C).

Chemical vapor deposition (CVD), for example, is used.

The carbon nanotube is grown by chemical vaporization using a 1 vs. 9 mixed gas of acetylene and argon and argon gas as the raw material gas, at a 50 sccm flow rate of the mixed gas, at a 950 sccm flow rate of the argon gas, under a 1 kPa total pressure, and at 850 C-substrate temperature.

Figure 16A:
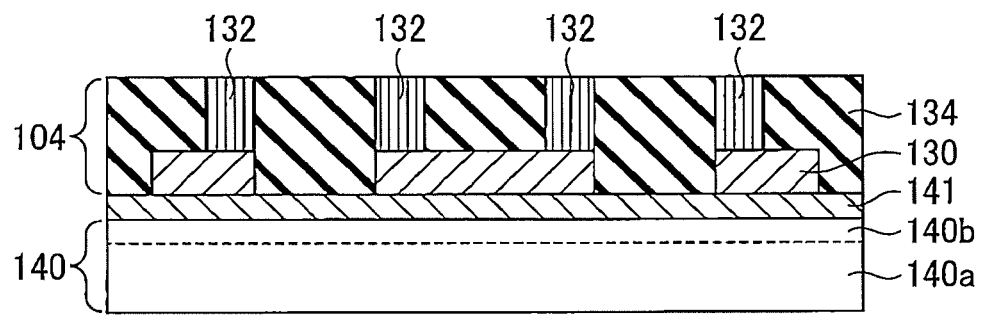
FIGS. 16A, 16B and 16C are sectional views of the semiconductor device in the steps of the semiconductor manufacturing method according to the third embodiment, which illustrate the method (Part 3)

Next, the carbon nanotube 148 on the inter-layer insulation film 134 and the inter-layer insulation film 134 are polished by chemical mechanical polishing (CMP) to planarize the upper surface (FIG. 16A).

Thus, the wiring structure 104 with the graphene wires 130a and the nanotube plugs 132 formed in the inter-layer insulation film 134 is formed on the silicon substrate 140 with an oxide film.

Next, the sample is loaded in an oxidation atmosphere of an oxidizer, e.g., an iron chloride-content oxidation atmosphere using anhydrous iron chloride ($FeCl_3$) at, e.g., 310 C and for, e.g., 12-24 hours.

Figure 16B:
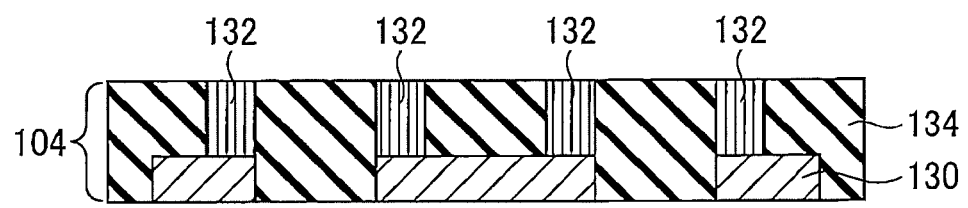

Thus, the catalyst metal film 141 is removed by the iron chloride and removed from the silicon substrate 140 with an oxide film, and the wiring structure 104 with the graphene wirers 130 and the nanotube plugs 132 formed in the inter-layer insulation film 134 is left alone (FIG. 16B).

Figure 16C:
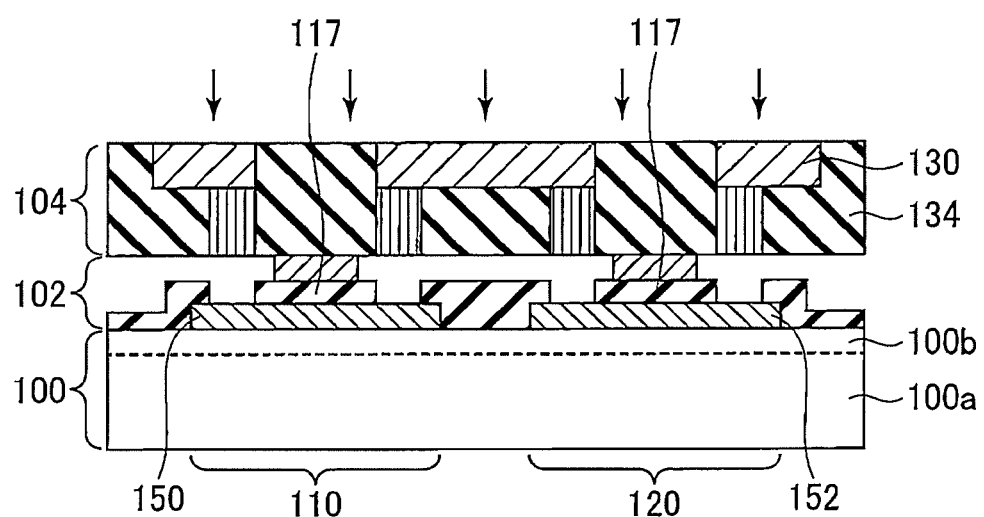

Then, the isolated wiring structure 104 is reversed and transposed on the element structure 102 with the silicon substrate 100 with an oxide film, which has been separately manufactured (FIG. 16C).

At this time, the molecules of the iron chloride intrude into the film of the graphene wires 130 and intercalated, and doping is made.

When the intercalated iron chloride is unnecessary, the sample is held in a vacuum at about 500 C to remove the intercalated iron chloride.

The intercalation can be made even before the transpose as long as the multi-layer graphene wires have been processed.

In this case, the catalyst layer is also removed, and in order to release the wiring structure from the substrate, it is recommendable to remove the silicon oxide film is with hydrofluoric acid or others.

The element structure 102 with the wiring structure 104 transposed on has been separately manufactured on the silicon substrate 100 with an oxide film.

The structure of the element structure 102 is as follows.

The method of manufacturing the element structure 102 is not described here.

The silicon substrate 100 with an oxide film is, e.g., an about 380 μm-thickness silicon substrate 100a with an about 90 nm-thickness silicon oxide film 100b formed on.

The element structure 102 formed on the silicon substrate 100 with an oxide film is of the CMOS structure, e.g., including the n-TFT 110 on the left side of FIG. 13 and the p-TFT 120 on the right side of FIG. 13.

The n-TFT 110 includes, e.g., an InGaAs layer 150 to be the channel.

The p-TFT 120 includes, e.g., a Ge layer 152 to be the channel.

The gate insulation film 117 of, e.g., $Al_2O_3$ is formed on the InGaAs layer 150 of the n-TFT 110 and the Ge layer 152 of the p-TFT 120.

The film thickness of the gate insulation film 117 may be, e.g., 5-100 nm and specifically, is preferably 1-10 nm.

On the gate insulation film 117 above the channel 112 of the n-TFT 110, the gate electrode 118 of, e.g., copper is formed, and on the gate insulation film 1117 above the channel 122 of the p-TFT 120, the gate electrode 129 of, e.g., copper is formed.

The film thickness of the gate electrode 118 of the n-TFT 110 and the gate electrode 128 of the p-TFT 120 may be, e.g., 0.5-100 nm and specifically is preferably 1-10 nm.

Figure 17:
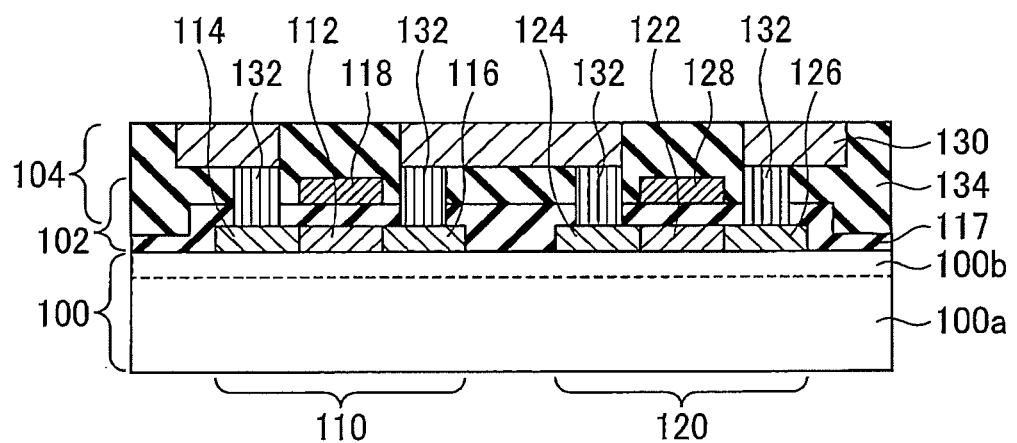
FIG. 17 is sectional views of the semiconductor device in the steps of the semiconductor manufacturing method according to the third embodiment, which illustrate the method (Part 4)

After the transpose of the wiring structure 104 on the element structure 102, thermal press is made (FIG. 16C) to contact the nanotube plugs 132 of the wiring structure 104 to the source electrode 114 and the drain electrode 116 of the n-TFT 110 of the element structure 102 and to the source electrode 124 and the drain electrode 126 of the element structure 102 (FIG. 17).

The following processing is made so as to secure the interfacial junction, for the contact, between the nanotube plugs 132 of the wiring structure 104, and the source region 114 and the drain region 116 of the n-TFT 110 and the source electrode 124 and the drain electrode 126 of the p-TFT 120.

As one processing, in advance, a Ni layer (not illustrated) is deposited on the forward ends of the nanotube plugs 132.

By, e.g., sputtering, the Ni layer (not illustrated) is deposited on the forward ends of the nanotube plugs 132.

Specifically, the Ni layer (not illustrated) is deposited after the nanotube plugs 132 have been synthesized in FIG. 15C, and then the unnecessary Ni layer (not illustrated) is removed by the planarization processing by the chemical mechanical polishing (CMP) in FIG. 14A.

The wiring structure 104 with the Ni layer (not illustrated) formed on the forward ends of the nanotube plugs 132 formed on is transposed on the element structure 102, and the thermal press is made at about 300 C.

As illustrated in FIG. 17, the InGaAs layer 150, which is the channel of the n-TFT 110 and the Ni layer (not illustrated) on the forward ends of the nanotube plugs 132 are alloyed, and the source electrode 114 and the drain electrode 116 of the InGaAs—Ni alloy are formed.

The Ge layer 152, which is the channel of the p-TFT 120 and the Ni layer (not illustrated) of the forward ends of the nanotube plugs 132s are alloyed, and the source electrode 124 and the drain electrode 126 of the Ge—Ni alloy are formed.

As one processing of the interfacial junction, it is possible to apply electron beams of high current density to the junction parts to fuse the interfaces.

The electron beams have a diameter of e.g., about 5-10 μm and a current of 10-100 μA are applied.

As one processing, it is possible to apply in advance argon plasma to and activate the forward ends of the nanotube plugs 132, which are the junction surfaces and make the press.

The same effect can be produced by applying argon plasma to the upper surfaces of the source electrode 114 and the drain electrode 166.

The argon plasma to be applied may be, e.g., 100 W for about 1 minute.

As one processing of the interfacial junction, junction electrodes may be formed.

As described above, the semiconductor device including the element structure 102 of, e.g., CMOS structure formed on the silicon substrate 100 with an oxide film, and the wiring structure 104 of the first layer wires formed on the element structure 102 can be manufactured.

[d] Fourth Embodiment

The semiconductor device according to a fourth embodiment and the method manufacturing the semiconductor device will be described with reference to FIGS. 18 and 19.

Figure 18:
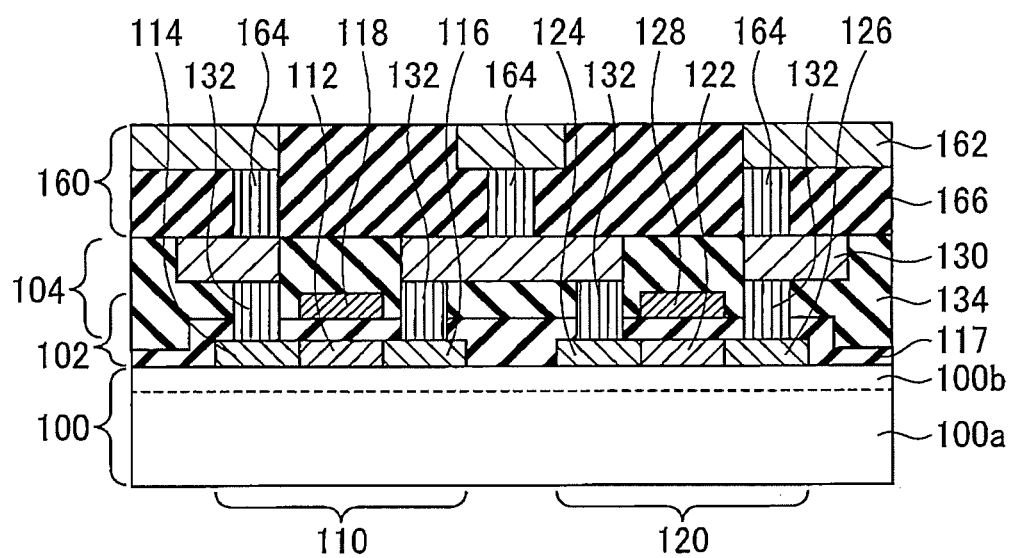
FIG. 18 is a view of the semiconductor device according to a fourth embodiment.

FIG. 18 is a view of the semiconductor device according to the fourth embodiment and FIG. 19 is sectional views of the semiconductor device according to the fourth embodiment manufacturing the semiconductor device.

The same member of this embodiment as those of the third embodiment are represented by the same reference numbers not to repeat their description.

(Semiconductor Device)

The semiconductor device according to this embodiment will be described with reference to FIG. 18.

The semiconductor device according to this embodiment includes an element structure of, e.g., CMOS on a substrate, a wiring structure of graphene wires and nanotube plugs formed on the element structure, and a wiring structure of graphene wires and nanotube plugs further formed on the wiring structure.

On the semiconductor device according to the third embodiment illustrated in FIG. 13, a wiring structure 160 is formed.

The wiring structure 160 includes graphene wires 162, and nanotube plugs 164 contacting the graphene wires 162 and graphene wires 130 of a wiring structure 104 of the lower layer, which are formed in an inter-layer insulation film 166.

The graphene wires 162 are formed upper in the inter-layer insulation film 166.

The nanotube plugs 164 are extended downward from the graphene wires 162 and contacted to the graphene layer 130 of the wiring structure 104 below.

The graphene wires 162 are formed of, e.g., multi-layer graphene film.

The wire length of the graphene wires 162 formed of multi-layer graphene film may be, e.g., 0.5-10000 nm, the wire width may be, e.g., 0.5-500 nm, and the wire thickness may be, e.g., 0.1-500 nm.

Specifically, it is preferable that the wire length of the graphene wires 162 formed of multi-layer graphene film is, e.g., 50-5000 nm, the wire width is, e.g., 1-20 nm, and the wire thickness is, e.g., 1-20 nm.

The nanotube plugs 164 are formed of, e.g., carbon nanotube (CNT).

The length of the nanotube plugs 164 formed of carbon nanotube may be, e.g., 1-500 nm, the diameter may be, e.g., 0.5-500 nm, and specifically, the length of the nanotube plugs 164 of carbon nanotube is preferably, e.g., 1-100 nm, and the diameter is preferably, e.g., 1-50 nm.

The inter-layer insulation film 166 is formed of, e.g. silicon oxide film.

The thickness of the inter-layer insulation film 166 may be, e.g., 0.5-10000 nm, specifically is preferably, e.g., 2-200 nm.

(Method of Manufacturing the Semiconductor Device)

The method of manufacturing the semiconductor device according to this embodiment will be described with reference to FIGS. 19A through 19C.

The semiconductor device to be manufactured in this embodiment includes an element structure of, e.g., CMOS formed on a substrate, a wiring structure of graphene wires and nanotube plugs formed on the device structure, and a wiring structure of graphene wires and nanotube plugs further formed on the wiring structure.

Figure 19A:
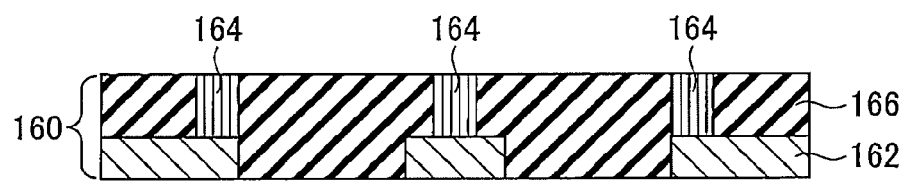
FIGS. 19A, 19B and 19C are sectional views of the semiconductor device in the steps of the semiconductor manufacturing method according to the fourth embodiment, which illustrate the method.
Figure 19B:
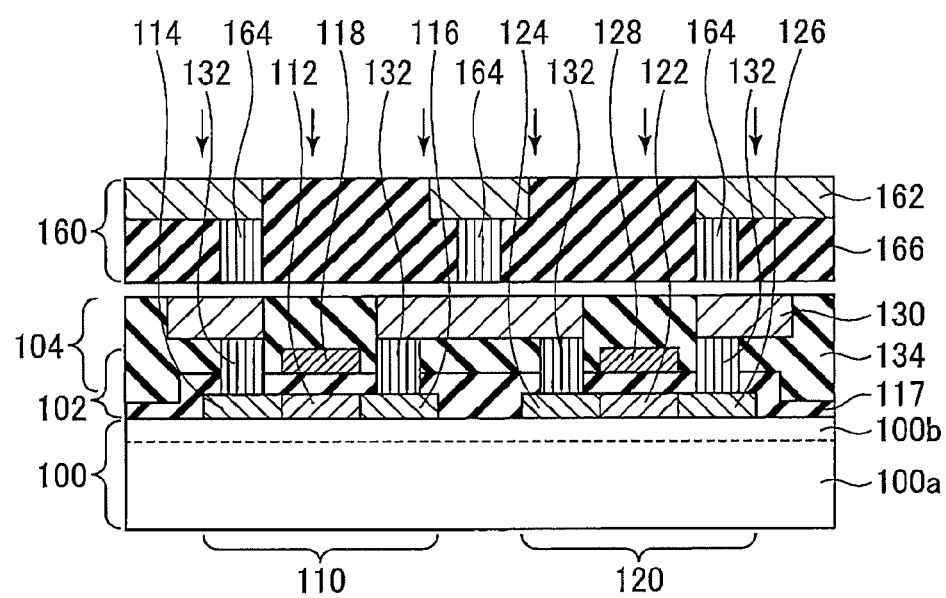

The wiring structure 160 is formed in the same process as that of the third embodiment illustrated in FIGS. 14A-16B (FIG. 19A).

The wiring structure 160 is different in the wiring pattern from the wiring structure 104 but is formed in the inter-layer insulation film 166 together with the graphene wires 162 and the nanotube plugs 164.

Then, the isolated wiring structure 160 is reversed and transposed on the wiring structure 104 of the semiconductor device according to the third embodiment, which has been separately formed. (FIG. 19B).

Figure 19C:
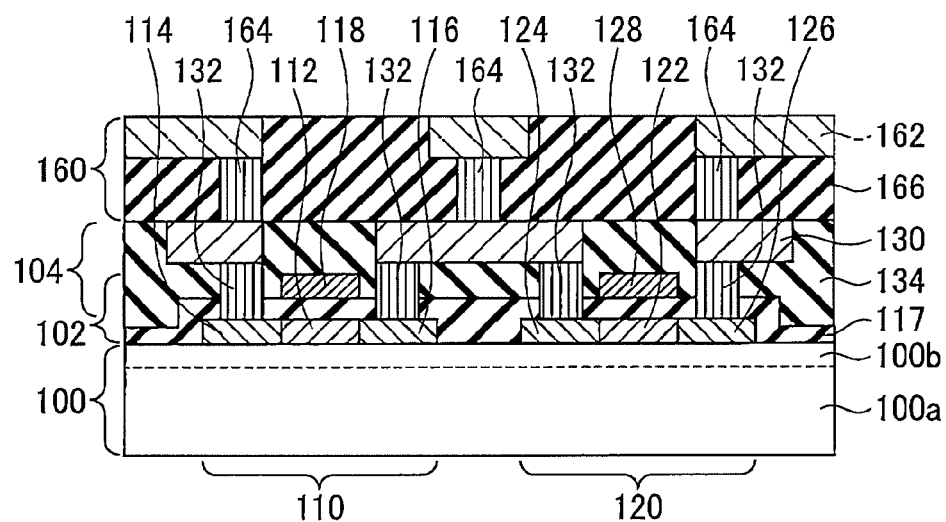

After the wiring structure 160 has been transposed on the wiring structure 104 of the semiconductor device according to the third embodiment, heat press is made to contact the nanotube plugs 164 of the wiring structure 160 to the graphene wires 130 of the wiring structure 104 (FIG. 19C).

The nanotube plugs 164 of the wiring structure 160 and the graphene wires 130 of the wiring structure 104 are securely jointed and contacted as follows.

As one processing of the interfacial junction, it is possible to apply electron beams of high current density to the junction parts to fuse the interfaces.

The electron beams have a diameter of e.g., about 5-10 μm and a current flow rate of 10-100 μA are applied.

At this time, about a few nm of a metal, amorphous carbon, titanium or others is vapor deposited to form the interfacial junctions.

As one processing, it is possible to apply in advance argon plasma to and activate the forward ends of the nanotube plugs 132, which are the junction surfaces and make the press.

The argon plasma to be applied may be, e.g., 100 W for about 1 minute.

As described above, the semiconductor device including the device structure 102 of, e.g., CMOS formed on the silicon substrate 100 with an oxide film, the wiring structure 104, which is the wires of the first layer formed on the element structure 102, and the wiring structure 160 of the second layer formed on the wiring structure 104 is manufactured.

[f] Modified Embodiments

The present invention is not limited to the above-described embodiments and can cover other various modifications.

In the above-described embodiments, the semiconductor element of the element structure forming the wiring structure including the wires of the nanocarbon material is a CMOS of the n-TFT whose channel is InGaAs channel and the p-TFT whose channel is Ge.

This is not essential. For example, the semiconductor element may be a CMOS of an n-TFT and a p-TFT whose channels are silicon thin film semiconductor layers.

Furthermore, the semiconductor element may be a CMOS of an n-TFT and a p-TFT whose channels are a layered compound semiconductor, such as h-BN, chalcogenide-group $MoS_2$ or WSe.

In the above-described embodiment, the wiring structure has 1 layer or 2 layers, but 3 or more layers of the wiring structure may be stacked.

The materials and conditions for the removal of the catalyst metal film and/or the intercalation of the graphene film are not limited to the materials and conditions in the above-described embodiments.

For example, the materials may be iron chloride ($FeCl_3$), niobium chloride ($NbCl_5$), copper chloride ($CuCl_2$), ytterbium chloride ($YbCl_3$), cobalt chloride ($CoCl_2$) or others.

As the conditions for the use of these materials, the sample may be retained in a vacuum of $10^{-2}$ Torr or below at the boiling points or temperatures lower by about 10-30% than the boiling pointes. The boiling points of iron chloride ($FeCl_3$), niobium chloride ($NbCl_5$), copper chloride ($CuCl_2$), ytterbium chloride ($YbCl_3$), cobalt chloride ($CoCl_2$) are respectively 350 C, 250 C, 1000 C, 700 C and 1000 C.

As the materials, not only chloride but also other various materials may be used. For example, other chlorides oxides, sulfides nitrides which are able to sublimate may be used.

As the material for the intercalation, alkali metal, alkaline earth, rare earth, halogen or others may be used.

As the alkali metal, lithium, kalium, potassium, rubidium, cesium, etc. are, for the intercalation, vapor deposited on a sample by vapor deposition, such as size getter or others, in an ultralight vacuum of $10^{-6}$ Torr or below and heated at about 200-500 C.

As the alkaline earth, magnesium, calcium, strontium, barium, etc. are, for the intercalation, held at around the respective boiling points, 700 C, 860 C, 800 C and 900 C in a vacuum of 1 Pa or below.

As the rare earth, samarium, europium, thulium, ytterbium, etc. are held at temperatures lowered by 1-30% than the respective boiling points, 850 C, 740 C, 950 C and 630 C in a vacuum of 10-4 Torr or below.

As the halogen, iodine, bromine, etc. may be used. For example, iodine, bromine, which sublimate at the room temperature, is sealed in a tightly-closed container, and in the container, a substrate with the graphene film formed on is held. The sublimated halogen molecules are intercalated through several days. To speed up the intercalation, the substrate is held at about 100 C.

The catalyst metal cannot be removed with the materials except halogen and is removed with an oxidation atmosphere using iron chloride.

As the material for the intercalation, organic molecules may be used. For example, fluorinated TCNQ, such as F4TCNQ (TFTCNQ) may be used. As the conditions for the intercalation, the fluorinated TCNQ is vapor deposited in the graphene film by resistance heating or electron beam vapor deposition in a vacuum at about 300 C.

As other materials to be used for the intercalation, nitrogen dioxide, titanium, potassium, ammonia, etc. may be used.

In the above-described embodiments, the graphene film is synthesized by thermal CVD but may be synthesized by other CVD, e.g., remote plasma CVD or plasma CVD.

In the above-described embodiments, as the raw material gas of the graphene film, methane gas is used, but other gas, e.g., hydrocarbon gas, such as ethylene gas or others, alcohol, such as ethanol or others, benzene, or solid materials, such as amorphous carbon or others, may be used.

In the above-described embodiments, as the catalyst metal for synthesizing the graphene film, nickel is used, but metal, such as cobalt, iron, copper platinum, gold or others, an alloy containing at least one of these metals, or a compound, such as carbide, oxide, nitride or others, may be used.

In the above-described embodiments, the catalyst metal is deposited by sputtering and electron beam vapor deposition, but may be deposited by other processes, such as molecular beam epitaxy (MBE).

The constituent materials, the manufacturing conditions, etc. of the synthesizing process of the graphene film described in the above-described embodiments are one example and can be suitably modified or changed in accordance with the technical common senses of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, comprising:
   forming on a substrate a wiring structure including wires of a nanocarbon material;
   forming on the wiring structure an element structure including semiconductor elements; and
   interconnecting the wires of the wiring structure and the semiconductor element of the element structure, wherein
   the wiring structure includes plugs connected to the wires, the plugs of the wiring structure being formed of carbon nanotube, and
   in the interconnecting, the plugs of the wiring structure and electrodes of the semiconductor element of the element structure are jointed.

2. A method of manufacturing a semiconductor device according to claim 1, wherein
   the plugs of the wiring structure is formed of a metal.

3. A method of manufacturing a semiconductor device according to claim 1, wherein
   the wires of the nanocarbon material of the wiring structure is formed of graphene.

4. A method of manufacturing a semiconductor device, comprising:
   forming a wiring structure including wires of a nanocarbon material;
   forming on a substrate an element structure including a semiconductor element; and
   transferring the wiring structure to the element structure formed on the substrate; and interconnecting the semiconductor element of the element structure and the wires of the wiring structure, wherein
   the wiring structure includes plugs connected to the wires, the plugs of the wiring structure being formed of carbon nanotube, and
   in the interconnecting, the plugs of the wiring structure and electrodes of the semiconductor element of the element structure are jointed.

5. A method of manufacturing a semiconductor device according to claim 4, wherein
   the plugs of the wiring structure is formed of a metal.

6. A method of manufacturing a semiconductor device according to claim 4, wherein
   the wires of the nanocarbon material of the wiring structure is formed of graphene.

7. A method of manufacturing a semiconductor device, comprising:
   forming on a substrate a wiring structure including wires of a nanocarbon material;
   forming on the wiring structure an element structure including semiconductor elements; and
   interconnecting the wires of the wiring structure and the semiconductor element of the element structure, wherein
   the semiconductor element of the element structure is a CMOS element including an n-TFT and a p-TFT, wherein
   the n-TFT includes a channel of InGaAs, and a source electrode and a drain electrode of an alloy of Ge and a metal, and
   the p-TFT includes a channel of Ge, and a source electrode and a drain electrode of an alloy of Ge and a metal.

8. A method of manufacturing a semiconductor device, comprising:
   forming a wiring structure including wires of a nanocarbon material;
   forming on a substrate an element structure including a semiconductor element; and
   transferring the wiring structure to the element structure formed on the substrate; and interconnecting the semiconductor element of the element structure and the wires of the wiring structure, wherein
   the semiconductor element of the element structure is a CMOS element including an n-TFT and a p-TFT, wherein
   the n-TFT includes a channel of InGaAs, and a source electrode and a drain electrode of an alloy of Ge and a metal, and
   the p-TFT includes a channel of Ge, and a source electrode and a drain electrode of an alloy of Ge and a metal.

9. A semiconductor device, comprising:
   a wiring structure formed on a substrate and including wires of a nanocarbon material; and
   an element structure formed on the wiring structure, the element structure including a semiconductor element,
   the wires of the wiring structure and the semiconductor element of the element structure being interconnected, wherein
   the wiring structure includes plugs connected to the wires, the plugs of the wiring structure being formed of carbon nanotube, and
   in the interconnecting, the plugs of the wiring structure and electrodes of the semiconductor element of the element structure are jointed.

10. A semiconductor device according to claim 9, wherein
   the wiring structure includes plugs of carbon nanotube connected to the wires, and
   the plugs of the wiring structure and electrodes of the semiconductor element of the element structure are jointed.

11. A semiconductor device, comprising:
   a wiring structure formed on a substrate and including wires of a nanocarbon material; and
   an element structure formed on the wiring structure, the element structure including a semiconductor element,
   the wires of the wiring structure and the semiconductor element of the element structure being interconnected, wherein
   the semiconductor element of the element structure is a CMOS element including an n-TFT and a p-TFT, wherein
   the n-TFT includes a channel of InGaAs, and a source electrode and a drain electrode of an alloy of Ge and a metal, and
   the p-TFT includes a channel of Ge, and a source electrode and a drain electrode of an alloy of Ge and a metal.

* * * * *